United States Patent
Sakuma

(10) Patent No.: US 8,987,088 B2
(45) Date of Patent: Mar. 24, 2015

(54) METHOD OF MANUFACTURING NONVOLATILE SEMICONDUCTOR MEMORY DEVICE

(71) Applicant: Kabushiki Kaisha Toshiba, Minato-ku (JP)

(72) Inventor: Kiwamu Sakuma, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/043,134

(22) Filed: Oct. 1, 2013

(65) Prior Publication Data
US 2014/0273372 A1 Sep. 18, 2014

(30) Foreign Application Priority Data
Mar. 15, 2013 (JP) .................. 2013-053682

(51) Int. Cl.
| | |
|---|---|
| H01L 21/336 | (2006.01) |
| H01L 29/66 | (2006.01) |
| H01L 21/28 | (2006.01) |
| H01L 27/115 | (2006.01) |
| H01L 29/788 | (2006.01) |
| H01L 29/792 | (2006.01) |

(52) U.S. Cl.
CPC .... *H01L 29/66666* (2013.01); *H01L 21/28273* (2013.01); *H01L 21/28282* (2013.01); *H01L 27/11551* (2013.01); *H01L 27/11578* (2013.01); *H01L 29/66825* (2013.01); *H01L 29/66833* (2013.01); *H01L 29/7889* (2013.01); *H01L 29/7926* (2013.01)
USPC .......................................................... 438/268

(58) Field of Classification Search
USPC .......................................................... 438/268
See application file for complete search history.

(56) References Cited

U.S. PATENT DOCUMENTS

| 7,352,018 | B2 | 4/2008 | Specht et al. | |
|---|---|---|---|---|
| 2008/0073635 | A1* | 3/2008 | Kiyotoshi et al. | 257/2 |
| 2010/0226195 | A1* | 9/2010 | Lue | 365/230.06 |
| 2012/0139030 | A1* | 6/2012 | Sakuma et al. | 257/326 |
| 2013/0175490 | A1* | 7/2013 | Kusai et al. | 257/1 |

FOREIGN PATENT DOCUMENTS

| JP | 2006-155750 | 6/2006 |
|---|---|---|
| JP | 2008-78404 | 4/2008 |

* cited by examiner

*Primary Examiner* — Benjamin Sandvik
*Assistant Examiner* — Farid Khan
(74) *Attorney, Agent, or Firm* — Oblon, McClelland, Maier & Neustadt, L.L.P.

(57) ABSTRACT

According to one embodiment, a method includes forming a gate insulating layer structure covering first and second stacked layer structures, forming a first conductive layer on the gate insulating layer structure, forming a sacrifice layer on the first conductive layer, patterning the first conductive layer and the sacrifice layer with a line & space pattern, filling an insulating layer in spaces of the line & space pattern, the insulating layer having an etching characteristic different from the sacrifice layer, forming trenches in lines of the line & space pattern by removing the sacrifice layer selectively, the trenches exposing the first conductive layer between the first and second stacked layer structures, and forming a second conductive layer on the first conductive layer in the trenches.

14 Claims, 29 Drawing Sheets

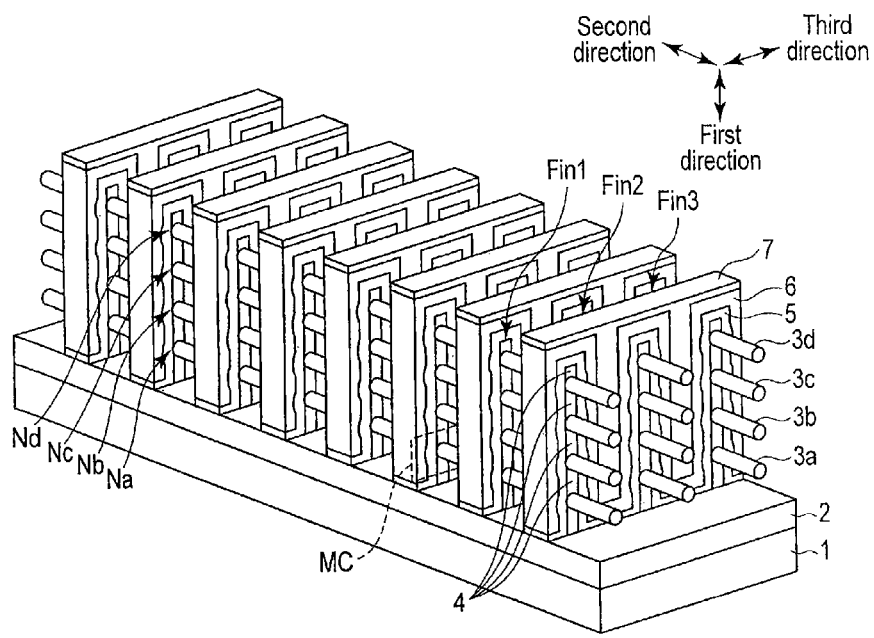
F I G. 1
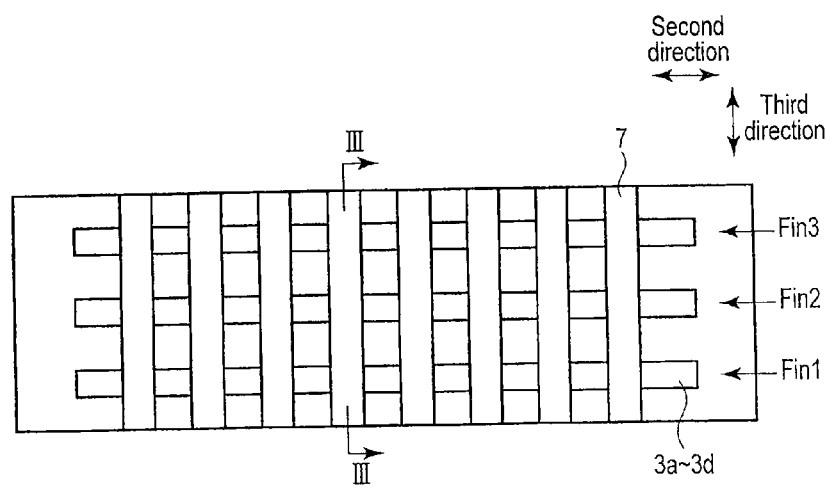
F I G. 2

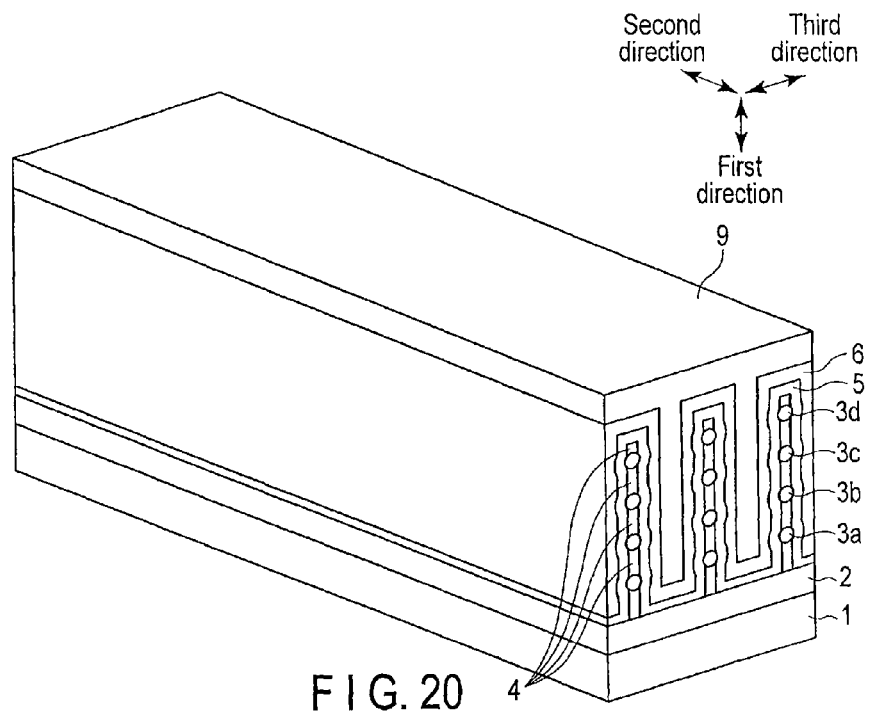
F I G. 20
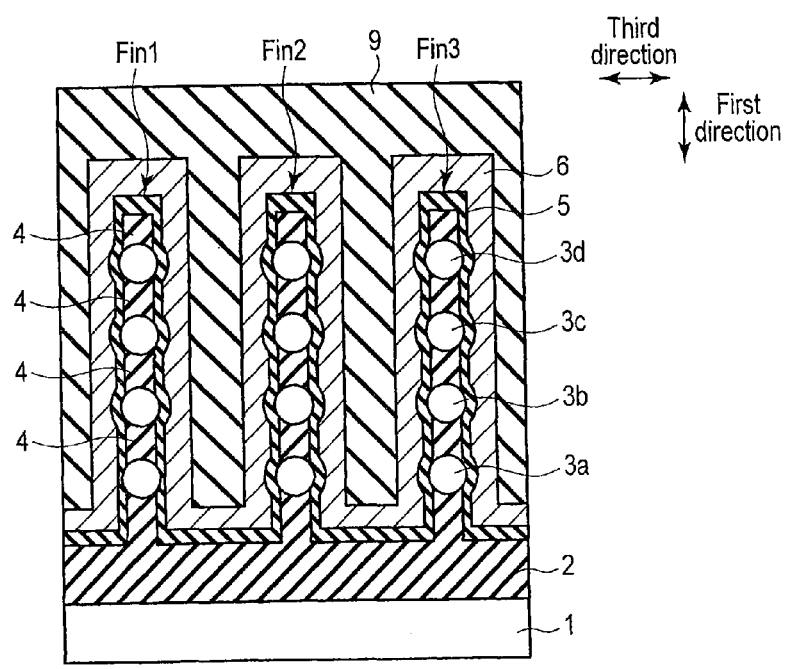
F I G. 21

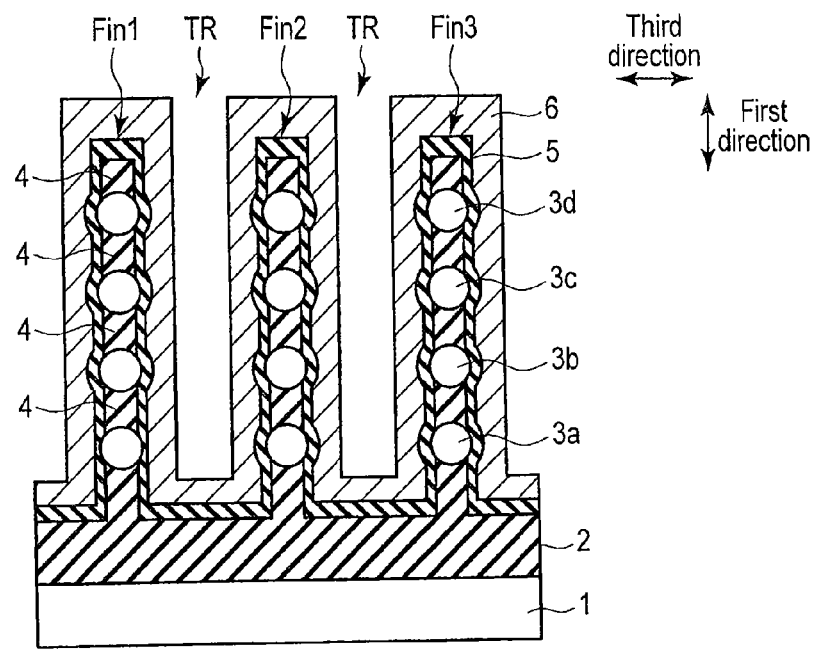
F I G. 26
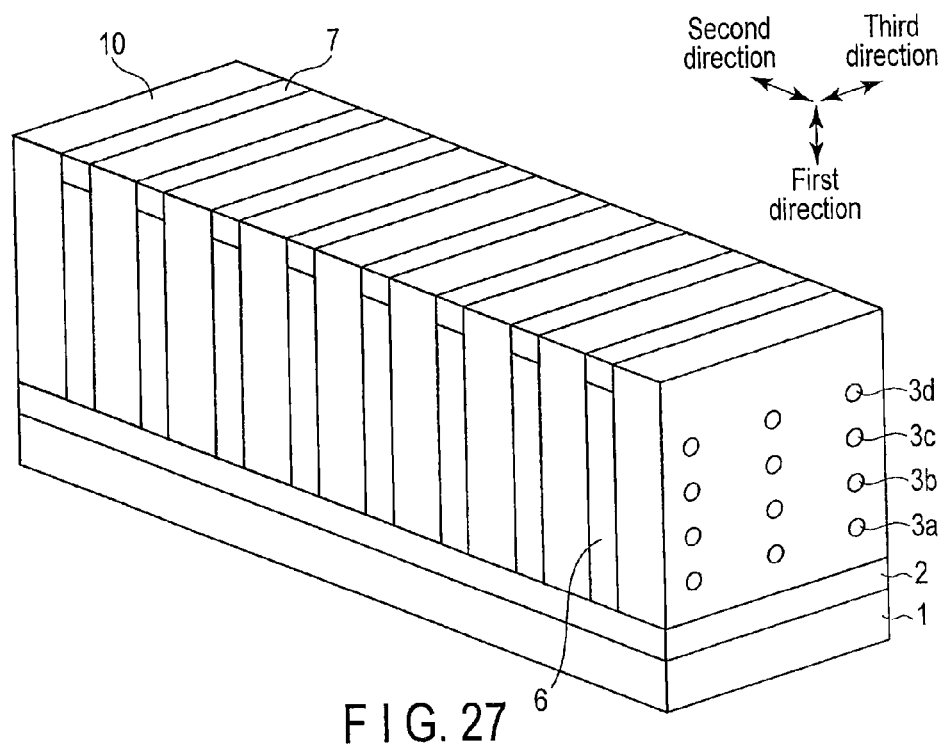
F I G. 27

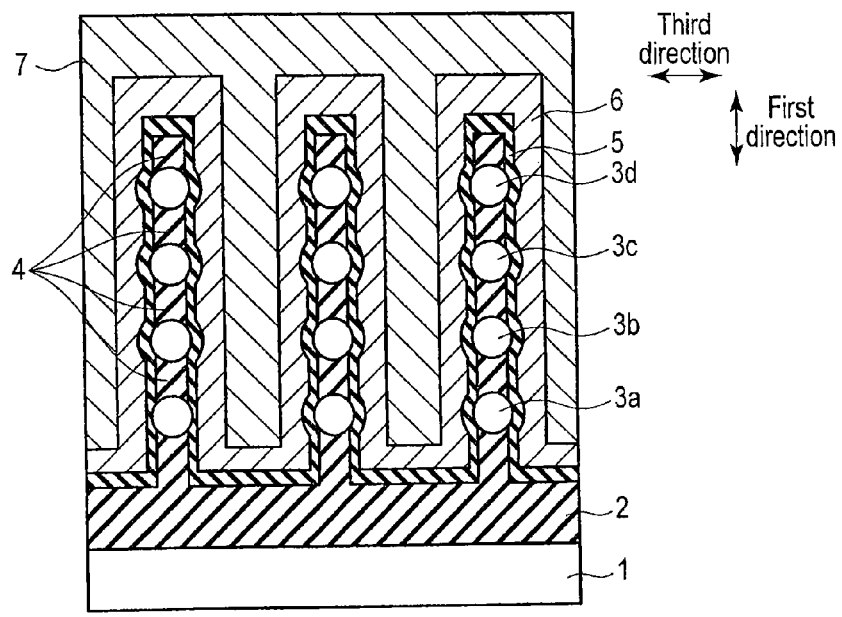
F I G. 28
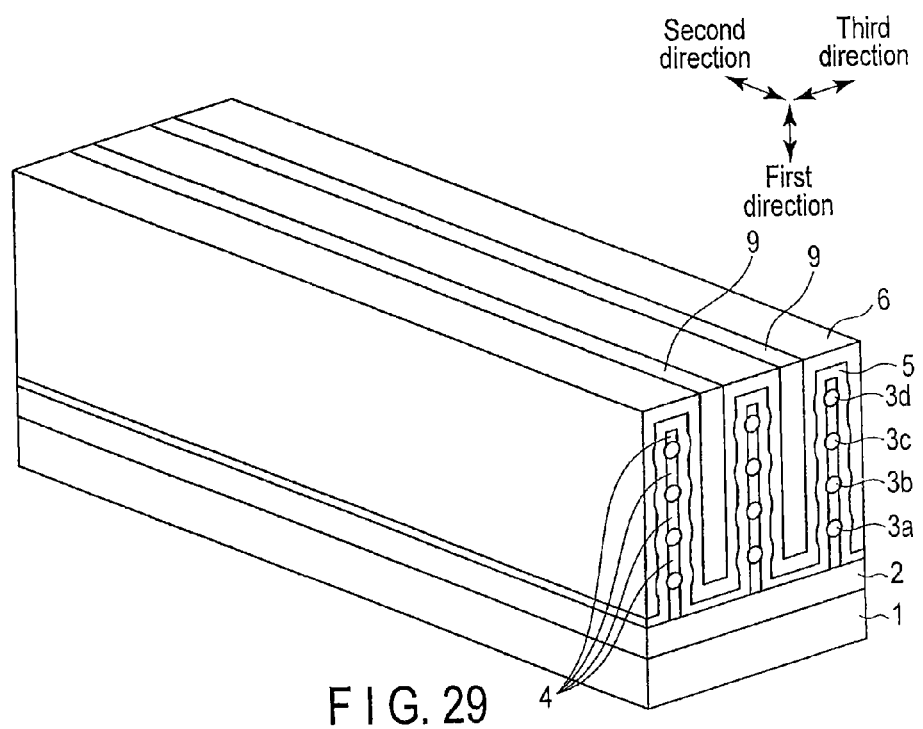
F I G. 29

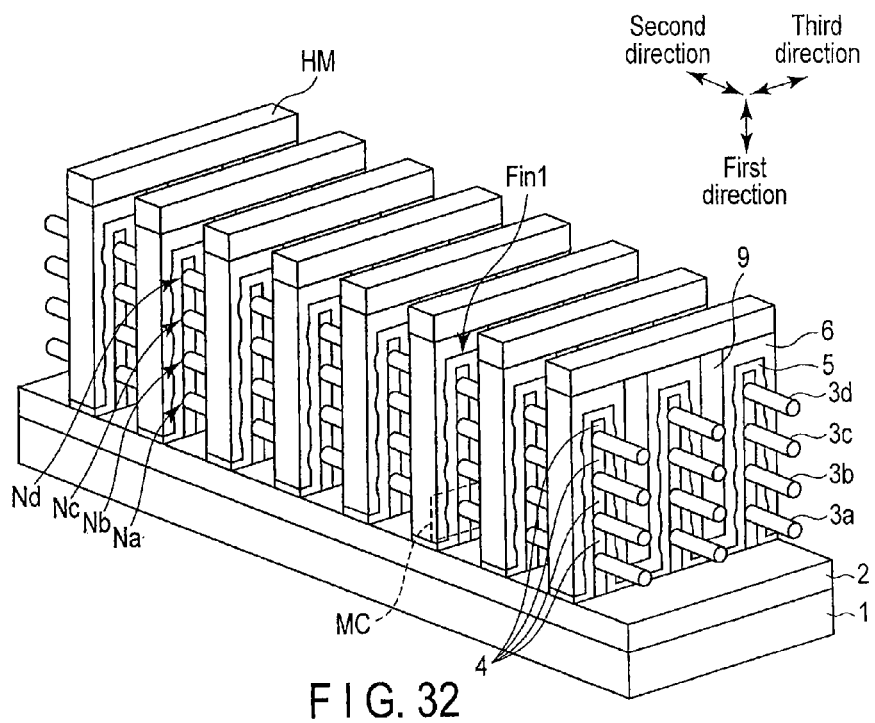
F I G. 32
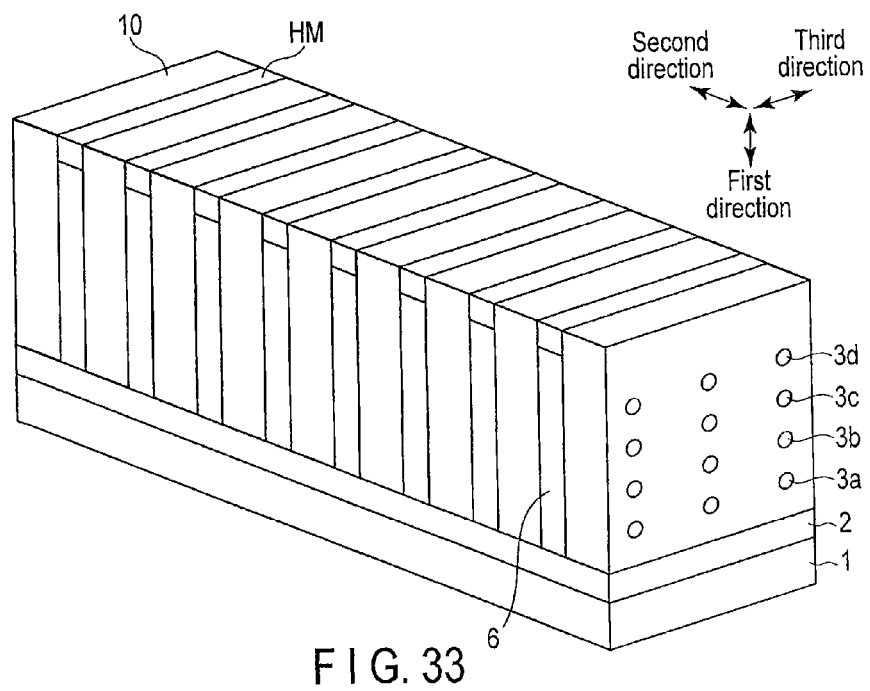
F I G. 33

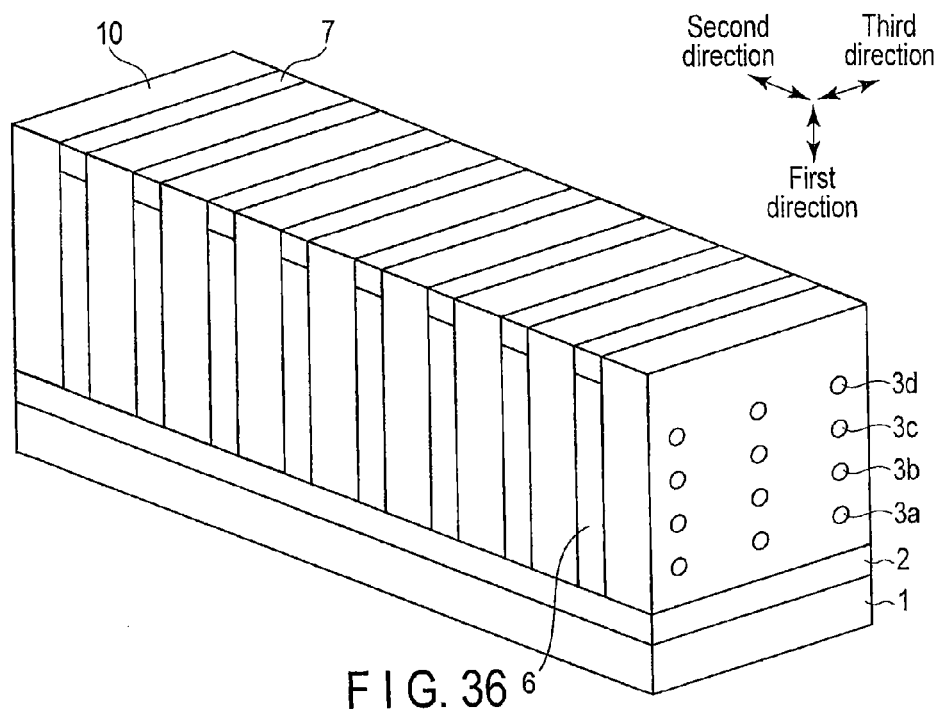
F I G. 36
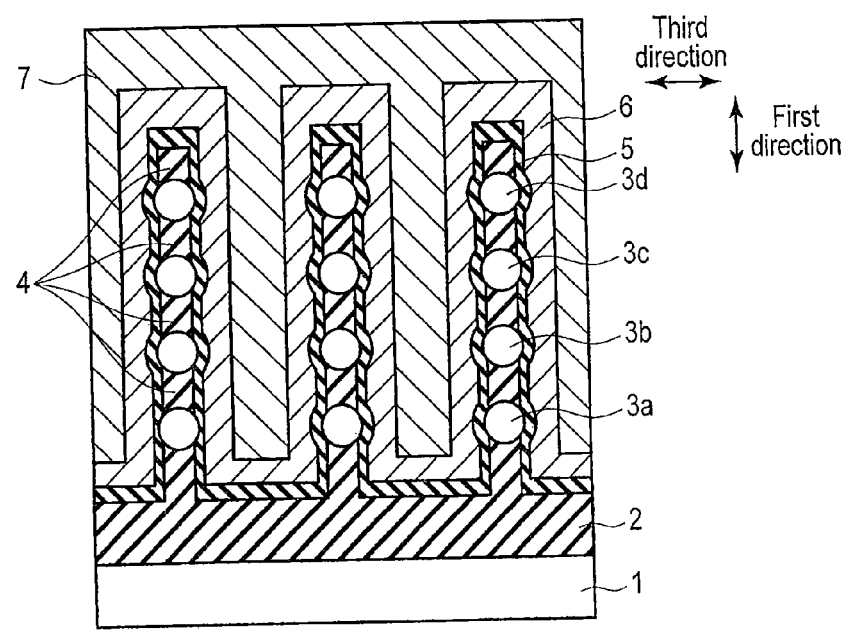
F I G. 37

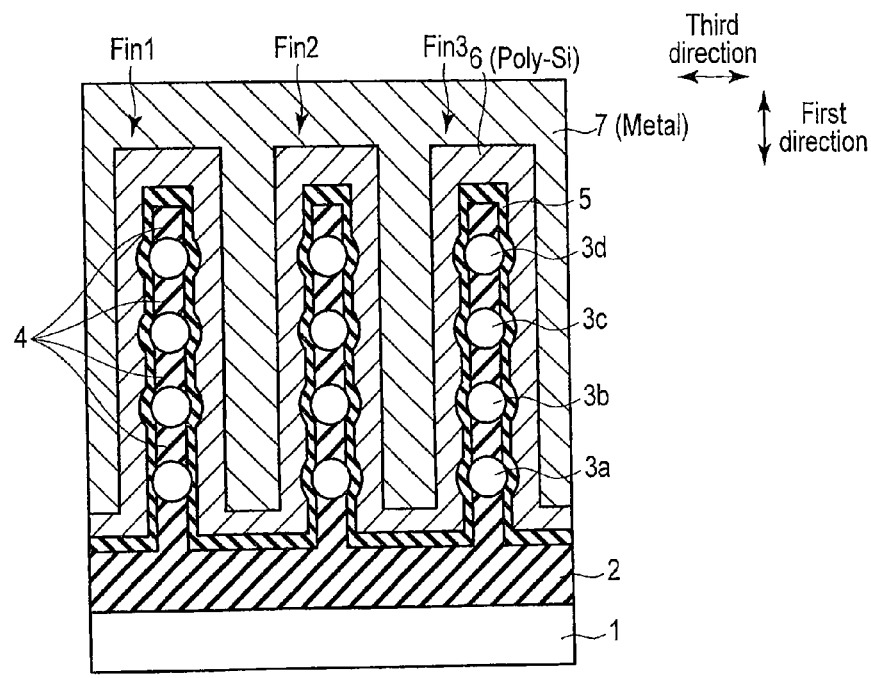
F I G. 38
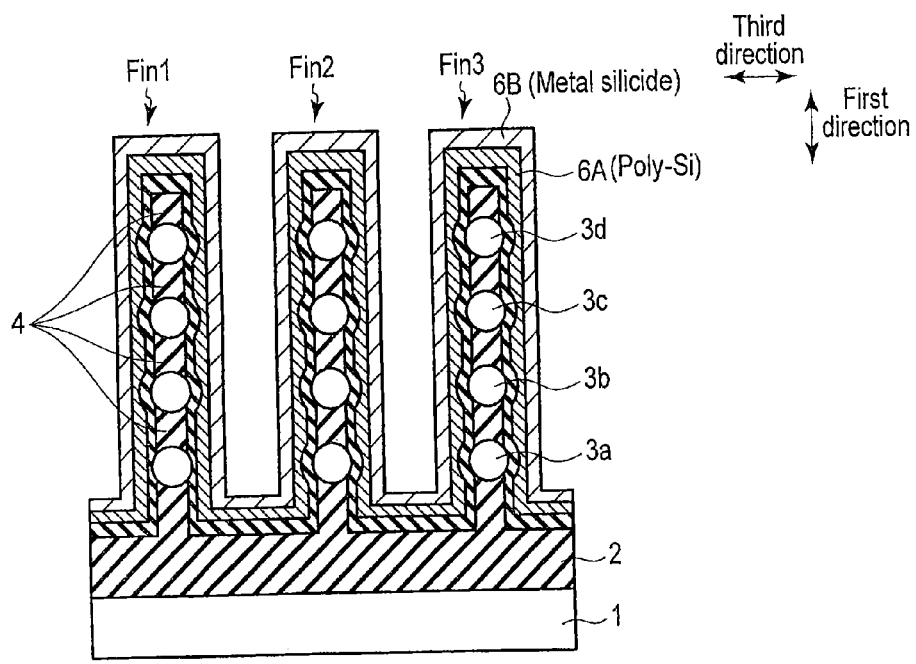
F I G. 39

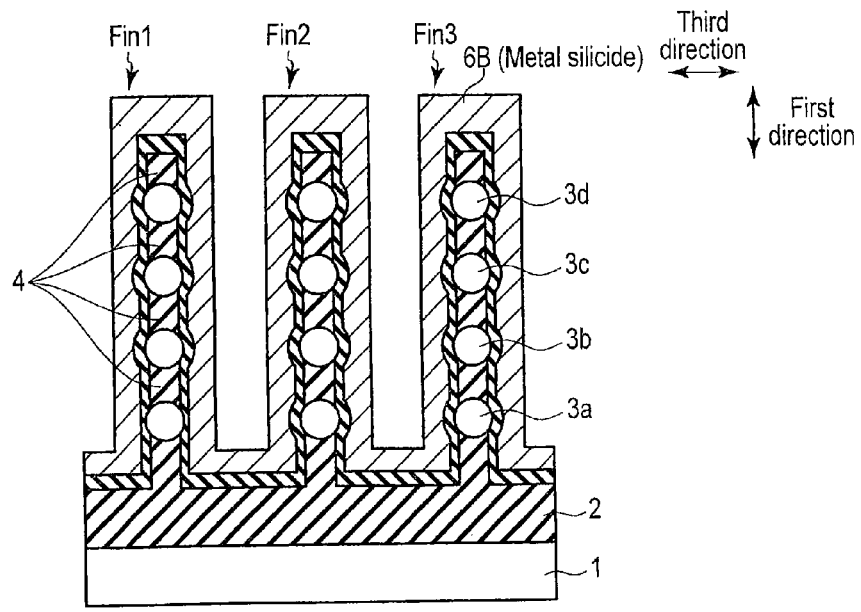
F I G. 40
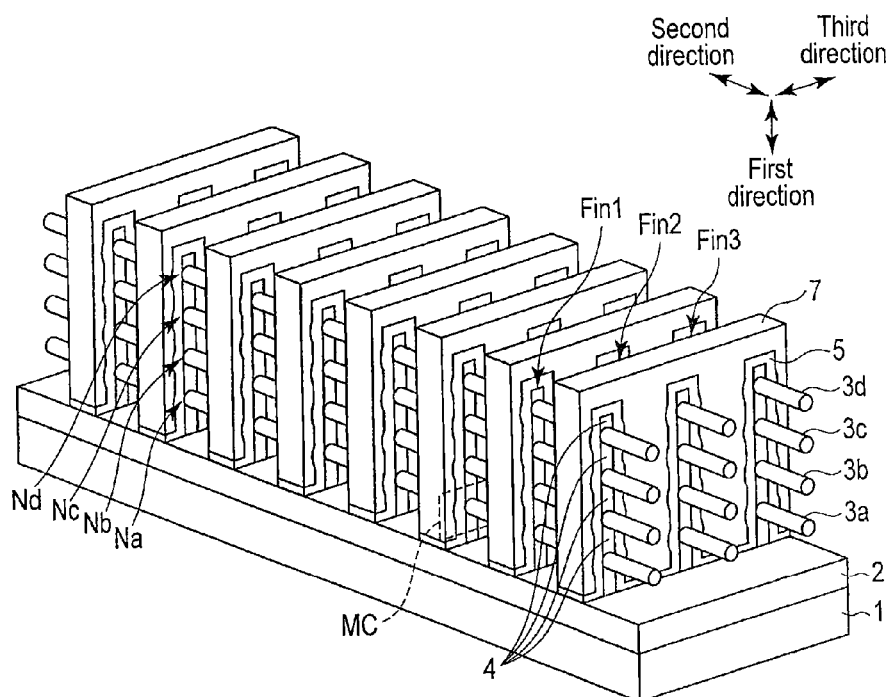
F I G. 41

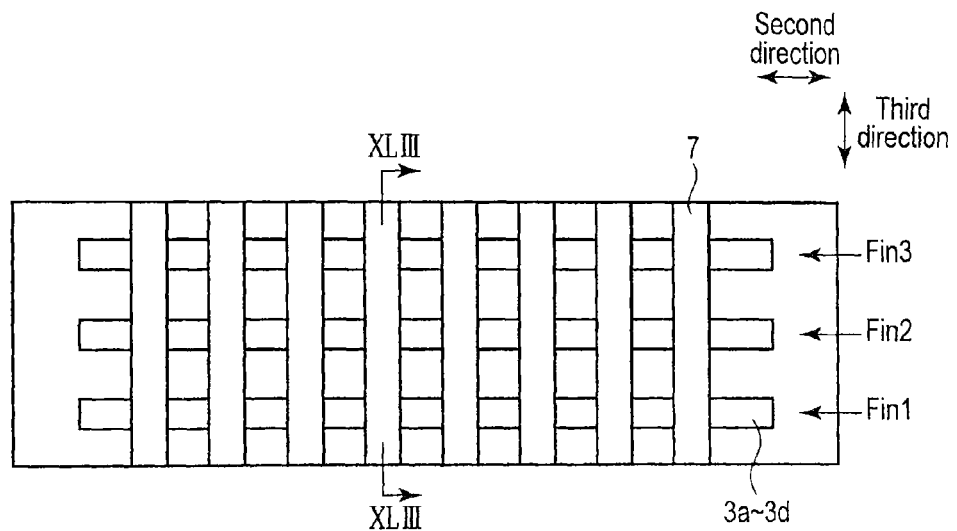
F I G. 42
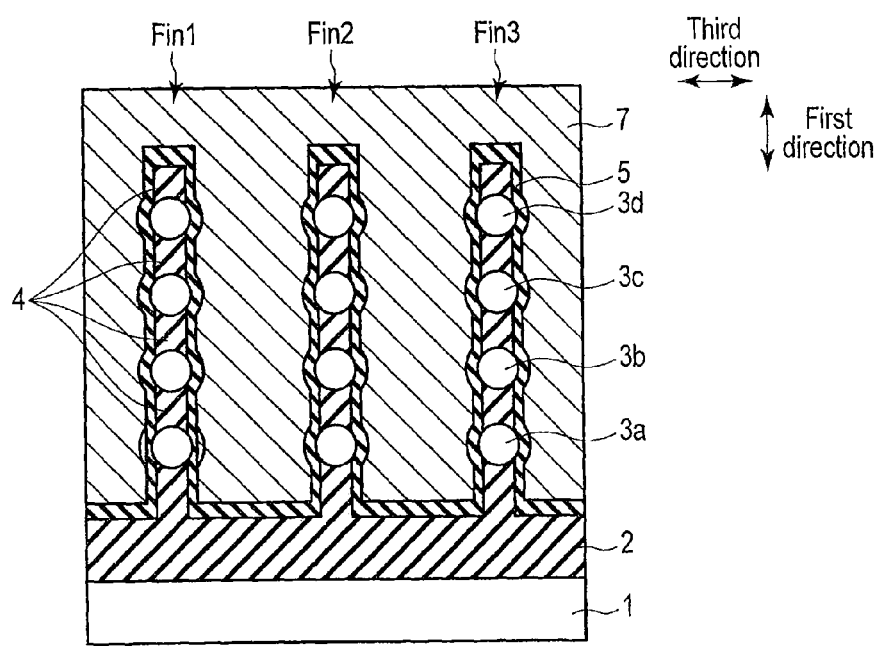
F I G. 43

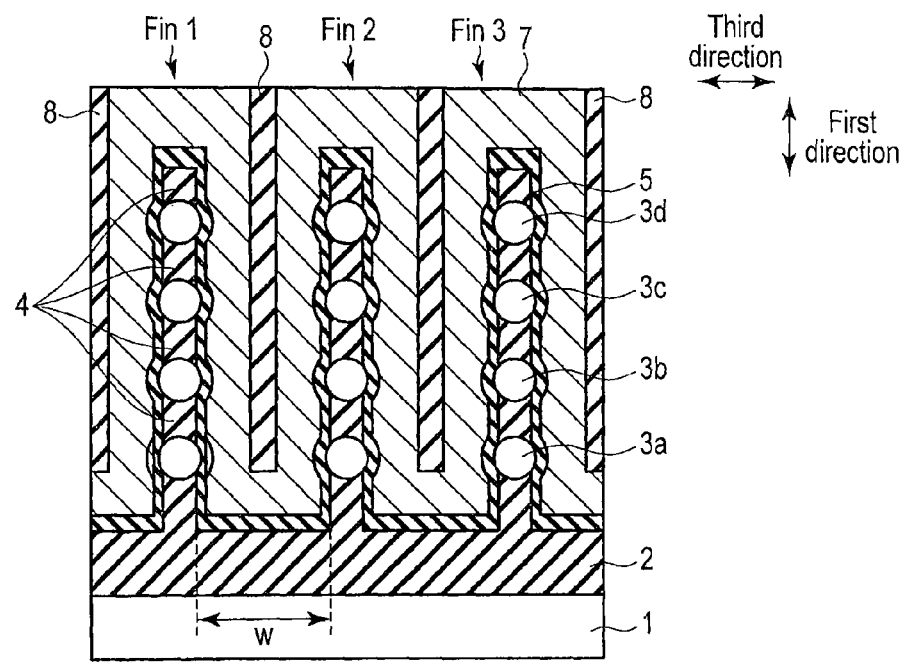
F I G. 44
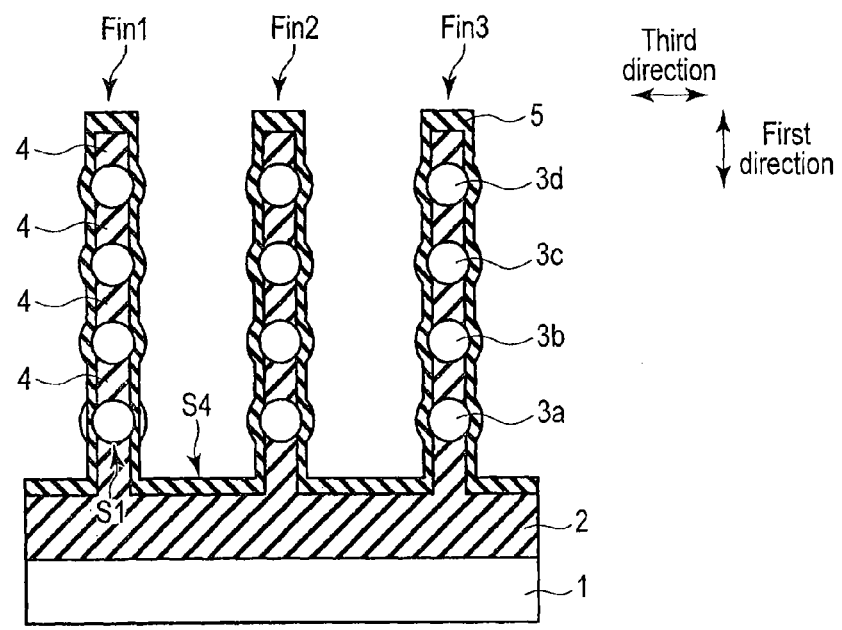
F I G. 45

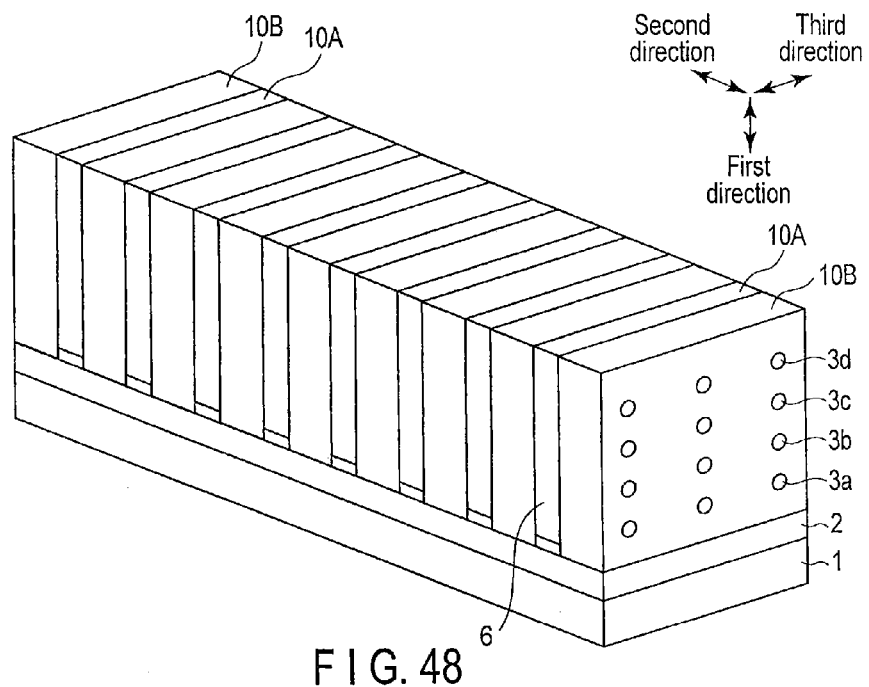
F I G. 48
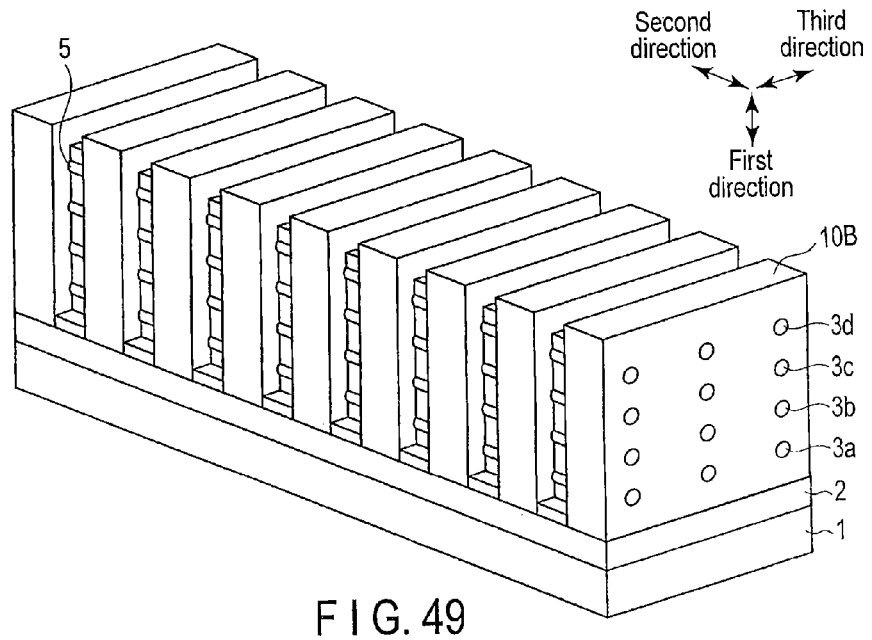
F I G. 49

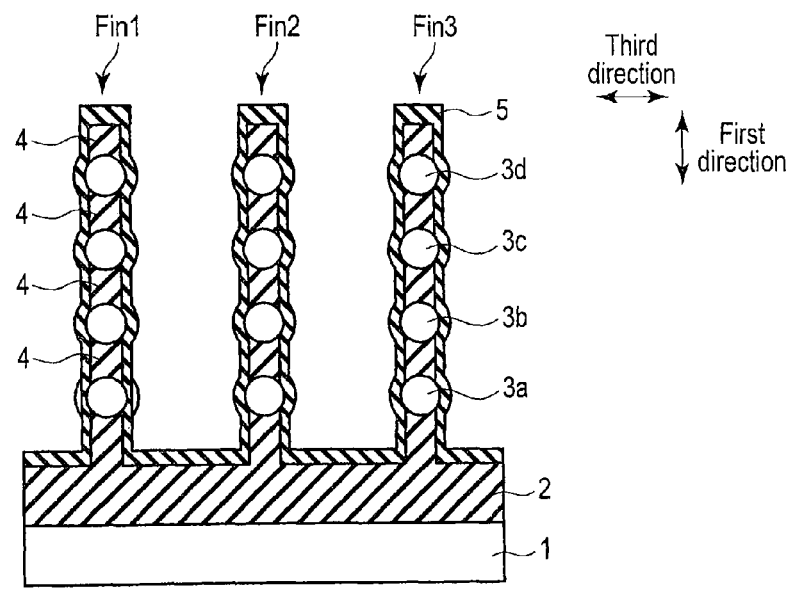
F I G. 50
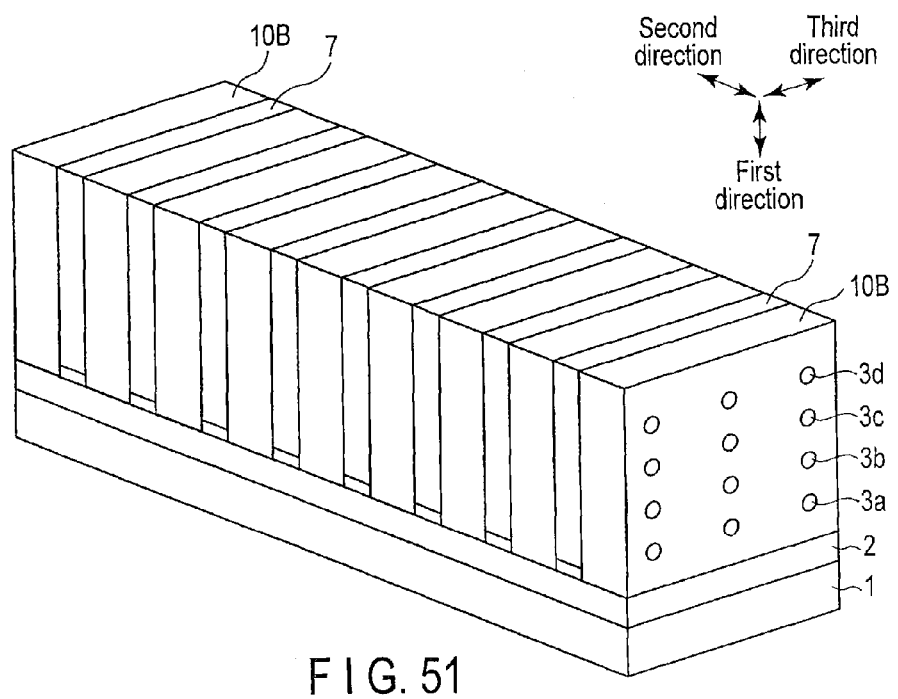
F I G. 51

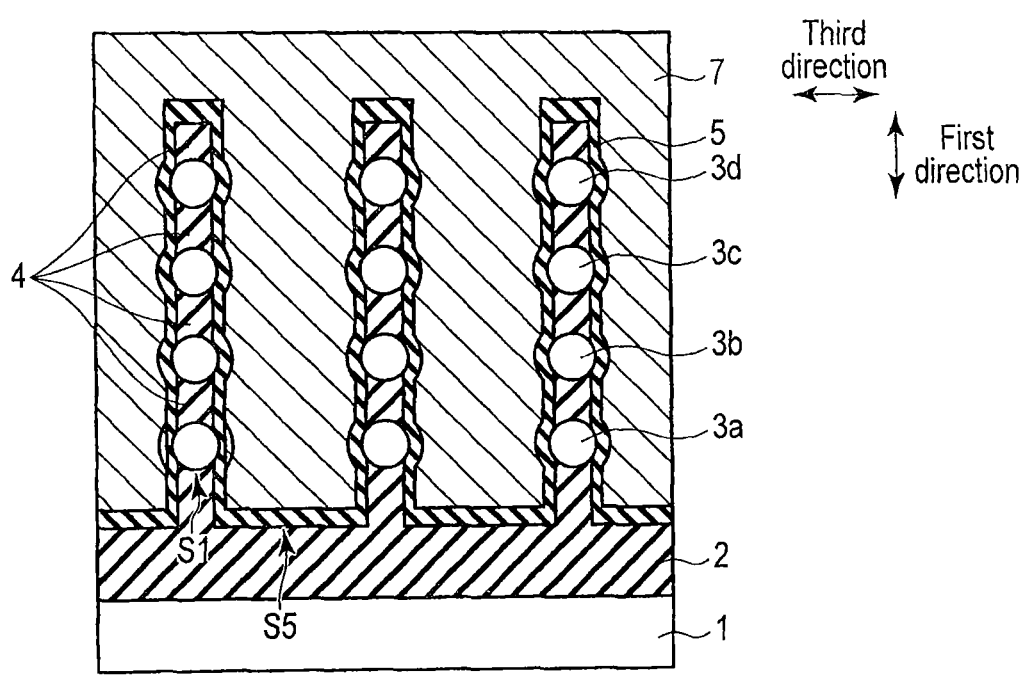
F I G. 52

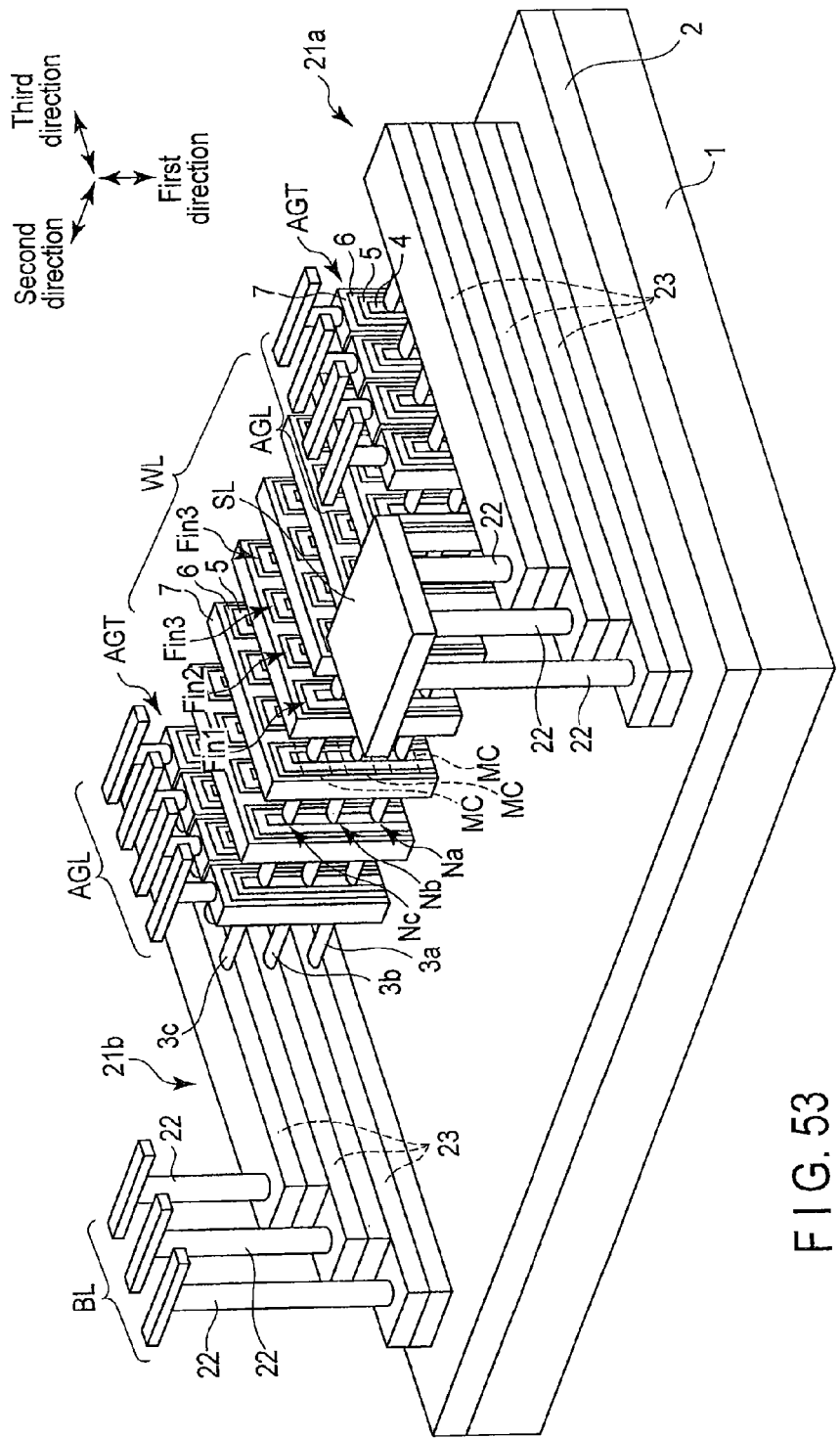
F I G. 53

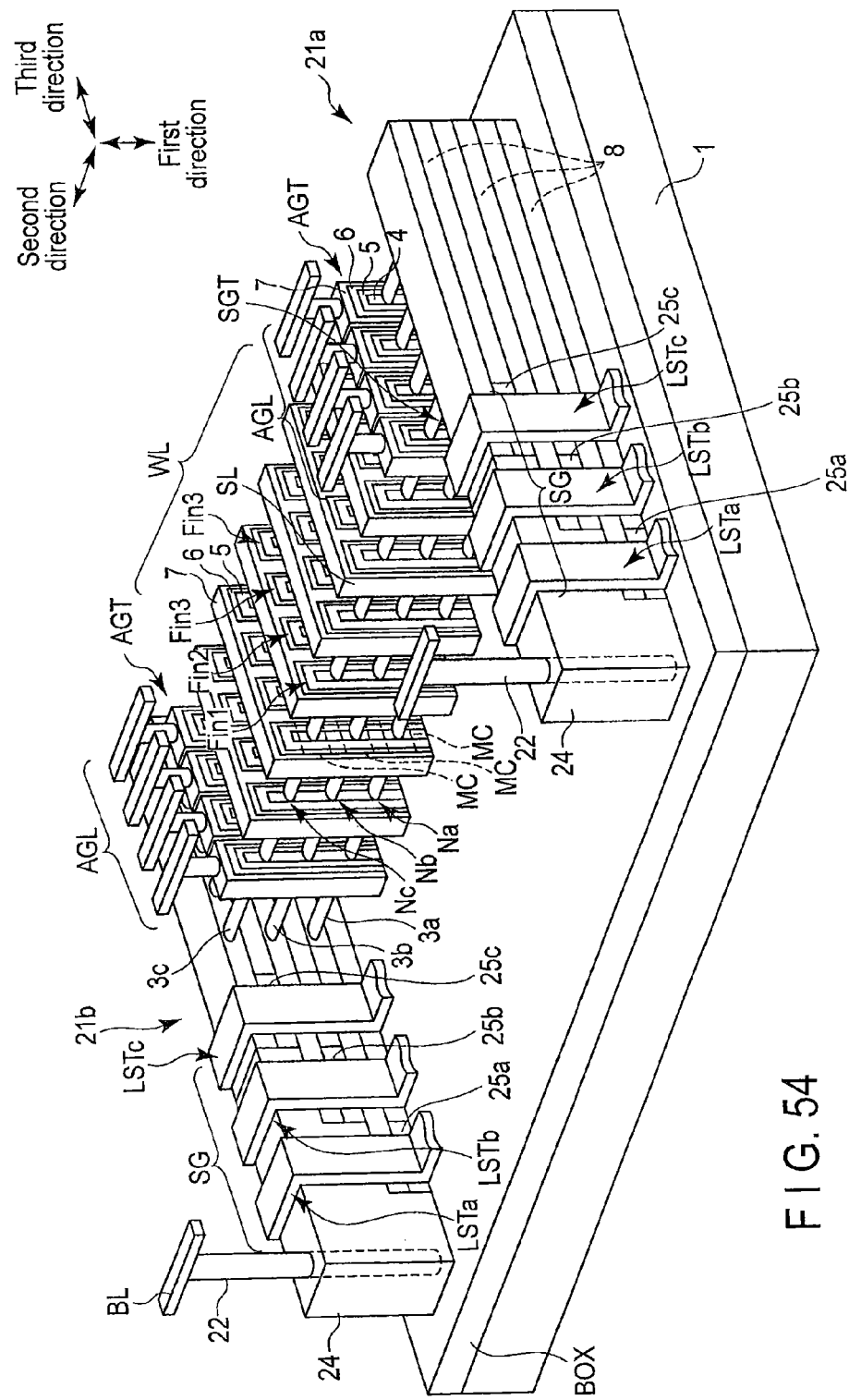
F I G. 54

US 8,987,088 B2

METHOD OF MANUFACTURING NONVOLATILE SEMICONDUCTOR MEMORY DEVICE

CROSS-REFERENCE TO RELATED APPLICATIONS

This application is based upon and claims the benefit of priority from Japanese Patent Application No. 2013-053682, filed Mar. 15, 2013, the entire contents of which are incorporated herein by reference.

FIELD

Embodiments described herein relate generally to a method of manufacturing a nonvolatile semiconductor memory device.

BACKGROUND

NAND type flash memories are widespread as memory devices for high-capacity data. At present, storage elements are miniaturized for per-bit cost reduction and capacity increase, and further miniaturization in the future is demanded. However, for further miniaturization of the flash memories, there are many problems to be solved, such as the development of lithographic technology, and the inhibition of a short channel effect, inter-element interference, and inter-element variation. Therefore, it may be difficult to make future continuous improvements of storage density by simply developing in-plane miniaturization technology alone.

Accordingly, in recent years, in order to increase the degree of integration of memory cells, developments have been made to shift the structure of the memory cells from a conventional two-dimensional (planar) structure to a three-dimensional (solid) structure, and various three-dimensional nonvolatile semiconductor memory devices have been suggested. One such structure is a vertical gate (VG) type semiconductor memory structure, and this structure is characterized in that a layout including peripheral elements and others is substantially equal to the planar structure so that an active area (AA) and a gate contact (GC) that are stacked can be collectively formed.

Now, the VG type three-dimensional structure has memory cells stacked in a vertical direction that share a control gate electrode extending in the vertical direction. Thus, it becomes difficult to form the control gate electrode by a metal layer if the number of stacked layers is increased for higher integration. This is attributed to the fact that the thickness of the metal layer to be fabricated is increased by the increase of the number of stacked layers so that the fabrication of the metal layer becomes substantially impossible.

Therefore, in the VG type three-dimensional structure, the control gate electrode of the memory cell is often formed by a polysilicon layer. In addition, the control gate electrode extends in a horizontal direction as a word line. Thus, a silicide layer (low-resistance layer) for the reduction of the wiring resistance of the word line is usually provided on the upper surface of the polysilicon layer as the word line (control gate electrode). However, the distance from the silicide layer to each memory cell in each hierarchical layer varies with the memory cell. That is, the distance from the silicide layer to the uppermost memory cell via the polysilicon layer higher in resistance value than the silicide layer is shorter. In contrast, the distance from the silicide layer to the lowermost memory cell via the polysilicon layer is longer.

This leads to a situation where there is a variation of electric resistance value from the silicide layer to each memory cell. That is, the lowermost memory cell has the lowest signal transmission velocity (the highest electric resistance) as compared with the uppermost memory cell. For normal operation in all the memory cells, an operation timing has to be decided in conformity to the lowermost memory cell having the lowest signal transmission velocity. This leads to the deterioration of the performance of the whole device. This drawback becomes more significant if the number of stacked layers is increased for higher integration.

BRIEF DESCRIPTION OF THE DRAWINGS

FIG. 1 is a perspective view showing a structure according to a first embodiment;
FIG. 2 is a plan view of FIG. 1;
FIG. 7 to FIG. 40 are diagrams showing a manufacturing method;
FIG. 41 is a perspective view showing a structure according to a second embodiment;
FIG. 42 is a plan view of FIG. 41;
FIG. 43 is a sectional view taken along the line XLIII-XLIII in FIG. 42;
FIG. 44 is a sectional view showing a structure as a modification;
FIG. 45 to FIG. 52 are diagrams showing a manufacturing method;
and
FIG. 53 and FIG. 54 are perspective views showing a VG type semiconductor memory structure as an application.

DETAILED DESCRIPTION

In general, according to one embodiment, a method of manufacturing a nonvolatile semiconductor memory device, the method comprising: forming first and second stacked layer structures each comprising active area layers, the active area layers stacked in a first direction and extending in a second direction which intersects with the first direction, the first and second stacked layer structures arranged in a third direction which intersects with the first and second directions; forming a gate insulating layer structure covering the first and second stacked layer structures; forming a first conductive layer on the gate insulating layer structure, a space between the first and second stacked layer structures not filled with the first conductive layer; forming a sacrifice layer on the first conductive layer, the space between the first and second stacked layer structures filled with the sacrifice layer; patterning the first conductive layer and the sacrifice layer with a line & space pattern comprising lines and spaces extending in the third direction; filling an insulating layer in the spaces of the line & space pattern, the insulating layer having an etching characteristic different from the sacrifice layer; forming trenches in the lines of the line & space pattern by removing the sacrifice layer selectively, the trenches exposing the first conductive layer between the first and second stacked layer structures; and forming a second conductive layer on the first conductive layer in the trenches.

Hereinafter, embodiments will be described with reference to the drawings.

1. First Embodiment

(1) Structure

Figure 3:
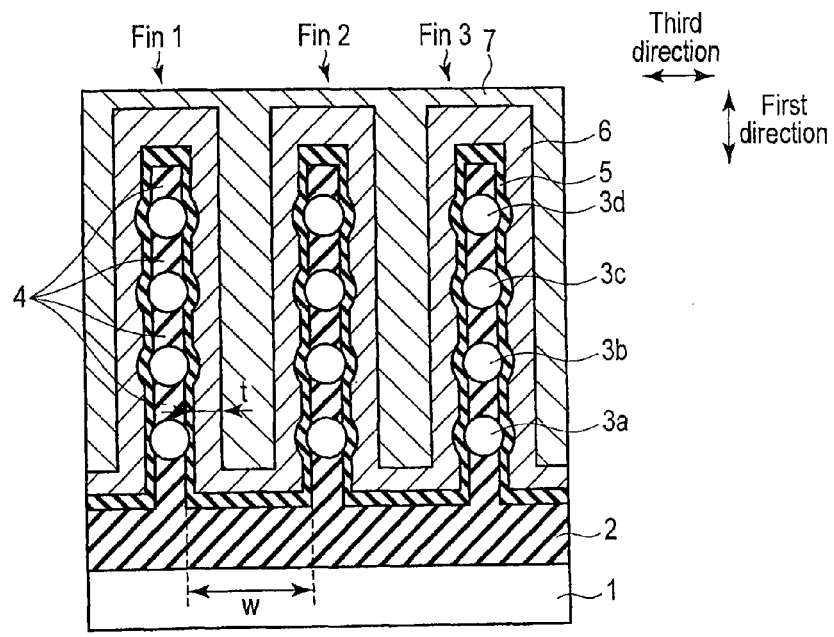
FIG. 3 is a sectional view taken along the line in FIG. 2.

FIG. 1 is a perspective view of a nonvolatile semiconductor memory device. FIG. 2 is a plan view of FIG. 1. FIG. 3 is a sectional view taken along the line III-III in FIG. 2.

Semiconductor substrate 1 is, for example, a silicon substrate. Insulating film 2 is, for example, a silicon oxide layer, and is disposed on semiconductor substrate 1.

Fin type stacked layer structures Fin1, Fin2, and Fin3 are disposed on insulating film 2. Each of fin type stacked layer structures Fin1, Fin2, and Fin3 has (four, in the present embodiment) active area layers 3a, 3b, 3c, and 3d stacked, for example, in a first direction perpendicular to the surface of semiconductor substrate 1.

Fin type stacked layer structures Fin1, Fin2, and Fin3 extend in a second direction parallel to the surface of semiconductor substrate 1, and are arranged in a third direction that intersects with the first and second directions.

Active area layers 3a, 3b, 3c, and 3d are, for example, semiconductor layers (e.g. monocrystalline silicon layer). Active area layers 3a, 3b, 3c, and 3d are insulated from one another by, for example, insulating layers (e.g. silicon oxide layers) 4 in parts where elements (e.g. memory cells and transistors) are formed, and are insulated from one another by cavities in other parts.

However, active area layers 3a, 3b, 3c, and 3d may be insulated from one another by insulating layers 4 in parts other than the parts where the elements are formed. That is, active area layers 3a, 3b, 3c, and 3d have only to be insulated from one another, and their insulating structure (e.g. the insulating layers and the cavities) is not limited.

Although four active area layers 3a, 3b, 3c, and 3d are stacked in the present embodiment, the number of active area layers in fin type stacked layer structures Fin1, Fin2, and Fin3 is not limited thereto.

A larger number of active area layers in fin type stacked layer structures Fin1, Fin2, and Fin3 is preferable for the increase of memory capacity in the nonvolatile semiconductor memory device.

The elements (e.g. the memory cells and select transistors) are arranged on the side surfaces of active area layers 3a, 3b, 3c, and 3d in the third direction. For example, memory strings Na, Nb, Nc, and Nd are arranged on active area layers 3a, 3b, 3c, and 3d. Each of memory strings Na, Nb, Nc, and Nd includes memory cells MC connected in series in the second direction.

Memory strings Na, Nb, Nc, and Nd may comprise two select transistors ST respectively connected to both ends of memory cells MC.

Figure 5:
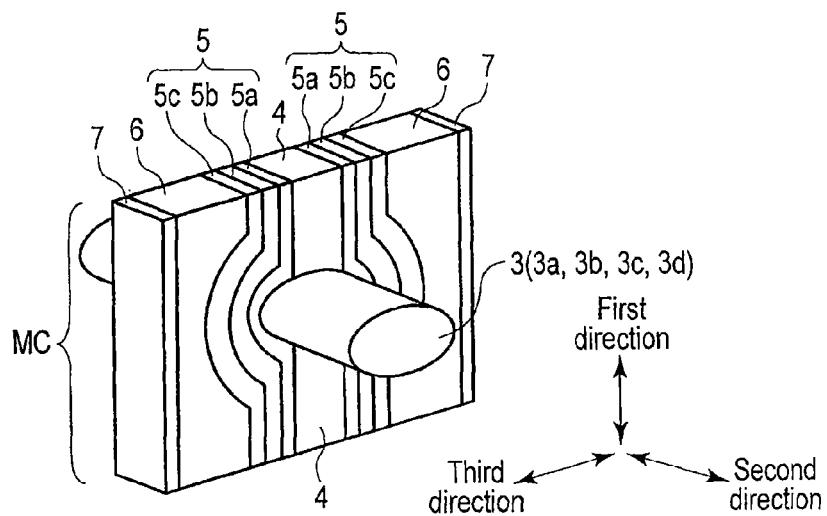
FIG. 5 is a perspective view showing a memory cell.

For example, as shown in FIG. 5, memory cell MC has gate insulating layer structure 5 disposed on the side surfaces of active area layers 3a, 3b, 3c, and 3d in the third direction. Gate insulating layer structure 5 comprises stacked layer structure having insulating layer 5a, storage layer 5b, and insulating layer 5c that are arranged in order. Semiconductor electrode layer (e.g. conductive polysilicon layer) 6 is disposed on gate insulating layer structure 5. Metal layer 7 is disposed on semiconductor electrode layer 6.

Select transistor ST may have the same structure as memory cell MC, or may have a structure different from that of memory cell MC. In the latter case, select transistor ST comprises has a structure in which, for example, gate insulating layer structure 5 in FIG. 5 has at least one of insulating layers 5a and 5c. That is, storage layer 5b in gate insulating layer structure 5 in FIG. 5 is omitted.

Here, when storage layer 5b has a charge storage layer (e.g. floating gate layer or charge trap layer), memory cell MC is a charge storage type memory cell such as a flash memory.

Semiconductor electrode layer 6 extends in the first direction on the side surfaces of fin type stacked layer structures Fin1, Fin2, and Fin3 in the third direction. However, when viewed from above fin type stacked layer structures Fin1, Fin2, and Fin3, semiconductor electrode layer 6 extends in the third direction as a whole. That is, for example, as obvious from FIG. 3, semiconductor electrode layer 6 extends zigzag in the third direction in a two-dimensional plane including the first and third directions.

Semiconductor electrode layer 6 has such thickness t that does not fill space W between fin type stacked layer structures Fin1, Fin2, and Fin3.

Therefore, metal layer 7 is disposed on semiconductor electrode layer 6, and fills space W between fin type stacked layer structures Fin1, Fin2, and Fin3.

Figure 6:
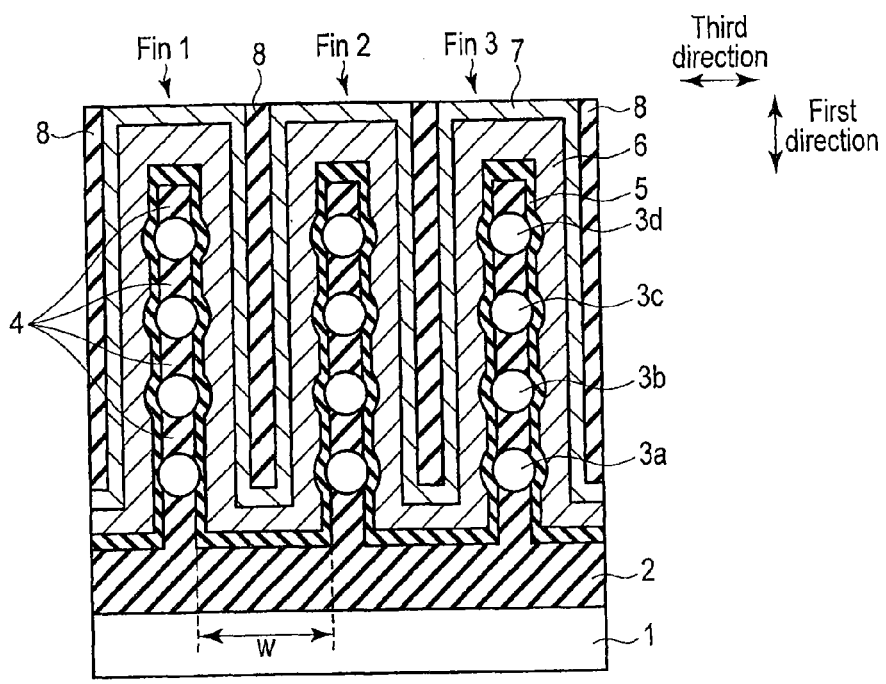
FIG. 6 is a sectional view showing a structure as a modification.

However, for example, as shown in FIG. 6, metal layer 7 does not need to fill space W between fin type stacked layer structures Fin1, Fin2, and Fin3. In this case, as shown in FIG. 6, space W between fin type stacked layer structures Fin1, Fin2, and Fin3 is filled with insulating layer 8 on metal layer 7.

In FIG. 6, insulating layer 8 may be omitted, and space W between fin type stacked layer structures Fin1, Fin2, and Fin3 may be a cavity.

Semiconductor electrode layer 6 and metal layer 7 function as, for example, word lines WL.

Here, between fin type stacked layer structures Fin1, Fin2, and Fin3, the lower surface of metal layer 7 is lower than the lower surface of lowermost active area layer 3a among active area layers 3a, 3b, 3c, and 3d.

This can eliminate the variation of signal delay time in memory cells MC within fin type stacked layer structures Fin1, Fin2, and Fin3, and improve the performance of the whole device. This advantageous effect is more significant, for example, when the number of active area layers in fin type stacked layer structures Fin1, Fin2, and Fin3 is larger and when fin type stacked layer structures Fin1, Fin2, and Fin3 are higher.

Figure 4:
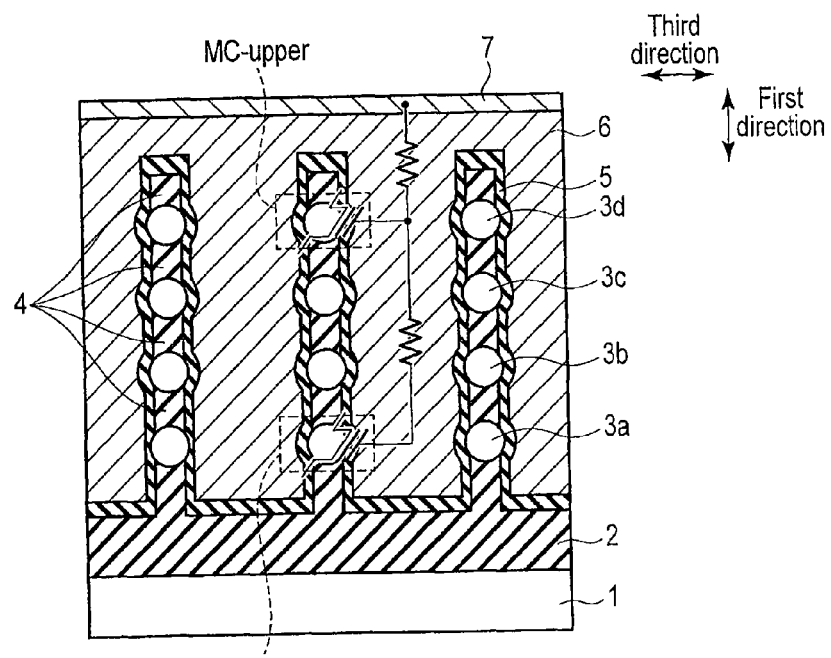
FIG. 4 is a sectional view showing a structure as a comparative example.

For example, in a comparative example shown in FIG. 4, the space between fin type stacked layer structures Fin1, Fin2, and Fin3 is completely filled with semiconductor electrode layer 6. In this case, as shown in FIG. 4, there is a variation of electric resistance value from metal layer 7 to each memory cell.

That is, while the electric resistance value from metal layer 7 to memory cell MC-upper disposed on uppermost active area layer 3d is extremely low, the electric resistance value from metal layer 7 to memory cell MC-lower disposed on lowermost active area layer 3a is extremely high. This difference is greater when the number of active area layers in fin type stacked layer structures Fin1, Fin2, and Fin3 is larger.

Thus, according to the present embodiment, high integration and high performance can be simultaneously obtained in a VG type three-dimensional semiconductor memory structure.

Incidentally, as shown in the comparative example in FIG. 4, the space between fin type stacked layer structures Fin1, Fin2, and Fin3 is filled with semiconductor electrode layer 6. This is because the patterning of semiconductor electrode layer 6 is easier than the patterning of metal layer 7.

A conventional process uses a step of patterning semiconductor electrode layer 6 or metal layer 7 after filling the space between fin type stacked layer structures Fin1, Fin2, and Fin3 with semiconductor electrode layer 6 or metal layer 7.

In this case, if fin type stacked layer structures Fin1, Fin2, and Fin3 are higher, the thickness of semiconductor electrode layer 6 or metal layer 7 existing in the space between fin type stacked layer structures Fin1, Fin2, and Fin3 is much greater.

Under such circumstances, when semiconductor electrode layer 6 or metal layer 7 is etched, semiconductor electrode layer 6 can be accurately etched in a short time, whereas the etching of metal layer 7 is inferior in accuracy and time to the etching of semiconductor electrode layer 6.

Thus, as shown in the comparative example in FIG. 4, the space between fin type stacked layer structures Fin1, Fin2, and Fin3 is generally filled with semiconductor electrode layer 6.

Accordingly, the present specification also suggests a new process which makes it possible to obtain, without the patterning (etching that uses a mask) of metal layer 7, the structure shown in FIG. 1 to FIG. 3, FIG. 5, and FIG. 6, that is, even the structure in which between fin type stacked layer structures Fin1, Fin2, and Fin3, the lower surface of metal layer 7 is lower than the lower surface of lowermost active area layer 3a among active area layers 3a, 3b, 3c, and 3d.

This will be described later.

(2) Material Examples

Now, examples of materials that constitute the elements of the structure shown in FIG. 1 to FIG. 3, FIG. 5, and FIG. 6 are described.

While materials best suited to the generations of the semiconductor memories can be properly selected as the materials that constitute the above-mentioned nonvolatile semiconductor memory device, examples of most often used materials are described below.

Active area layers 3a, 3b, 3c, and 3d are, for example, silicon (Si) layers. Insulating layer 4 is, for example, silicon oxide ($SiO_2$) layer. The silicon layers are preferably monocrystalline, but may be amorphous or polycrystalline. Active area layers 3a, 3b, 3c, and 3d may be semiconductor layers of, for example, Ge, or compound semiconductor layers of, for example, SiGe. Insulating layer 4 may have a stacked layer structure including, for example, silicon oxide ($SiO_2$) and silicon nitride ($SiN_x$).

Storage layer 5b in memory cell MC is, for example, a charge storage layer (e.g. floating gate layer or a charge trap layer), or a variable resistance layer (e.g. a material layer which varies in resistance value with a voltage, a current, or heat).

When storage layer 5b in memory cell MC is a charge storage layer, gate insulating layer structure 5 comprises insulating layer (tunnel insulating layer) 5a, storage layer (charge storage layer) 5b, and insulating layer (block insulating layer) 5c.

When storage layer 5b is a floating gate layer, storage layers 5b in memory cells MC are preferably separate from one another. Meanwhile, when storage layer 5b is a charge trap layer, storage layers 5b in memory cells MC may be separate from one another or may be bonded to one another.

Insulating layer (tunnel insulating layer) 5a is, for example, silicon oxide ($SiO_2$) layer. Storage layer (charge storage layer) 5b is, for example, silicon nitride ($Si_3N_4$) layer. Insulating layer (block insulating layer) 5c is, for example, an aluminum oxide ($Al_2O_3$) layer.

Insulating layer (tunnel insulating layer) 5a may be, for example, a stacked layer structure of silicon oxynitride, silicon oxide, and silicon nitride. Insulating layer (tunnel insulating layer) 5a may include, for example, silicon nanoparticles or meal ions.

Storage layer (charge storage layer) 5b is made of at least one of the materials selected from the group consisting of, for example, silicon-rich SiN, $Si_xN_y$ having any composition ratio x, y of silicon and nitrogen, silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), and lanthanum aluminate ($LaAlO_3$).

Storage layer (charge storage layer) 5b may include, for example, silicon nanoparticles or metal ions. Storage layer (charge storage layer) 5b may otherwise be made of impurity-added polysilicon or a conductor such as a metal.

Insulating layer (block insulating layer) 5c is made of at least one of the materials selected from the group consisting of, for example, silicon oxide ($SiO_2$), silicon oxynitride (SiON), aluminum oxide ($Al_2O_3$), aluminum oxynitride (AlON), hafnia ($HfO_2$), hafnium aluminate ($HfAlO_3$), hafnia nitride (HfON), hafnium nitride-aluminate (HfAlON), hafnium silicate (HfSiO), hafnium nitride-silicate (HfSiON), lanthanum oxide ($La_2O_3$), lanthanum aluminate ($LaAlO_3$), and lanthanum aluminum silicate (LaAlSiO).

Semiconductor electrode layer 6 is, for example, a conductive polysilicon layer including a P-type impurity or an N-type impurity.

Metal layer 7 is made of a metal compound such as nickel silicide (NiSi), tantalum nitride (TaN), tantalum carbide (TaC), or titanium nitride (TiN), or an electrically conductive metallic material such as Ni, V, Cr, Mn, Y, Mo, Ru, Rh, Hf, Ta, W, Ir, Co, Ti, Er, Pt, Pd, Zr, Gd, Dy, Ho, and Er and silicides of these substances.

Metal layer 7 may be, for example, a Ge compound (germanide).

Metal layer 7 may also be a combination of the above-mentioned materials.

(3) Manufacturing Method (First Example)

A first example of a method of manufacturing the structure shown in FIG. 1 to FIG. 3, FIG. 5, and FIG. 6 is described.

Figure 7:
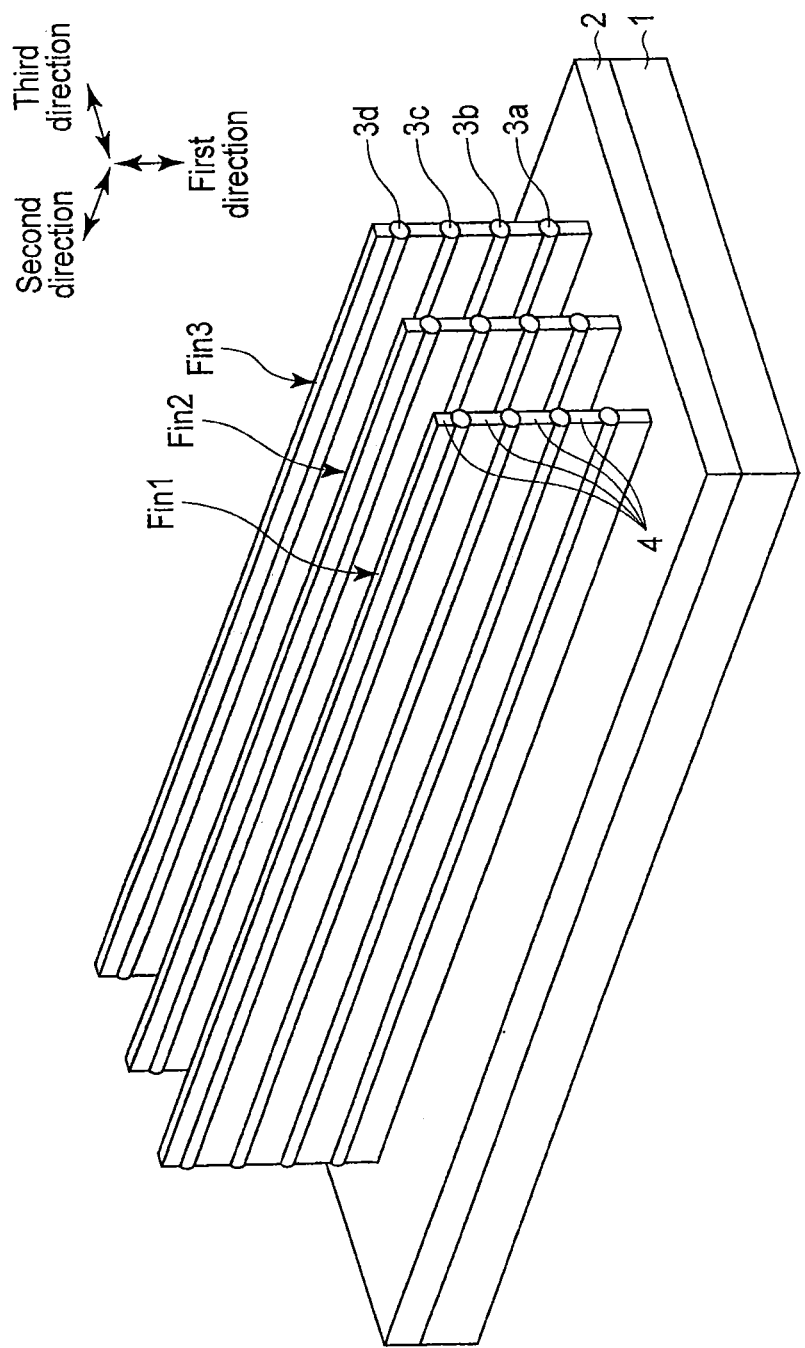
Figure 8:
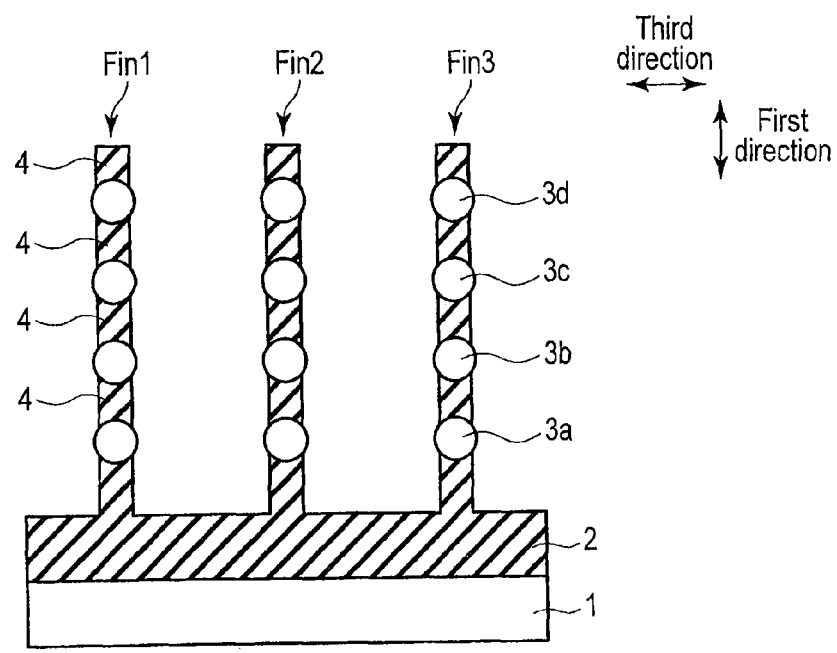

First, as shown in FIG. 7 and FIG. 8, first-conductivity-type (e.g. p-type) semiconductor substrate (e.g. silicon substrate) 1 having, for example, a plane direction (100) and a specific resistance of 10 to 20 Ωcm is prepared. On this semiconductor substrate 1, a stacked layer structure comprising insulating layers (e.g. silicon oxide layers) 2 and 4 and active area layers (e.g. monocrystalline silicon) 3a, 3b, 3c, and 3d is formed.

For example, a resist pattern is then used as a mask to etch the stacked layer structure. Thereby, fin type stacked layer structures Fin1, Fin2, and Fin3 extending in the second direction and arranged in the third direction are formed. The resist pattern is then removed.

Fin type stacked layer structures Fin1, Fin2, and Fin3 may be patterned by using a hard mask layer (e.g. silicon nitride layer or silicon oxide layer) as a mask. In this case, fin type stacked layer structures Fin1, Fin2, and Fin3 may include the hard mask layer (uppermost layer).

Figure 9:
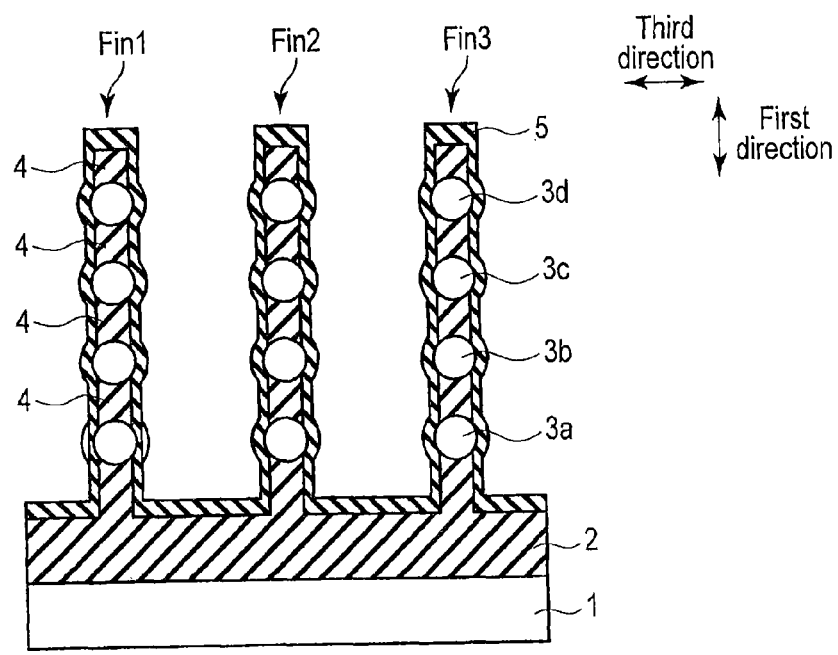

As shown in FIG. 9, gate insulating layer structure 5 covering fin type stacked layer structures Fin1, Fin2, and Fin3 is then formed. For example, as shown in FIG. 5, gate insulating layer structure 5 has three-layer structure of insulating layer 5a, storage layer 5b, and insulating layer 5c.

Figure 10:
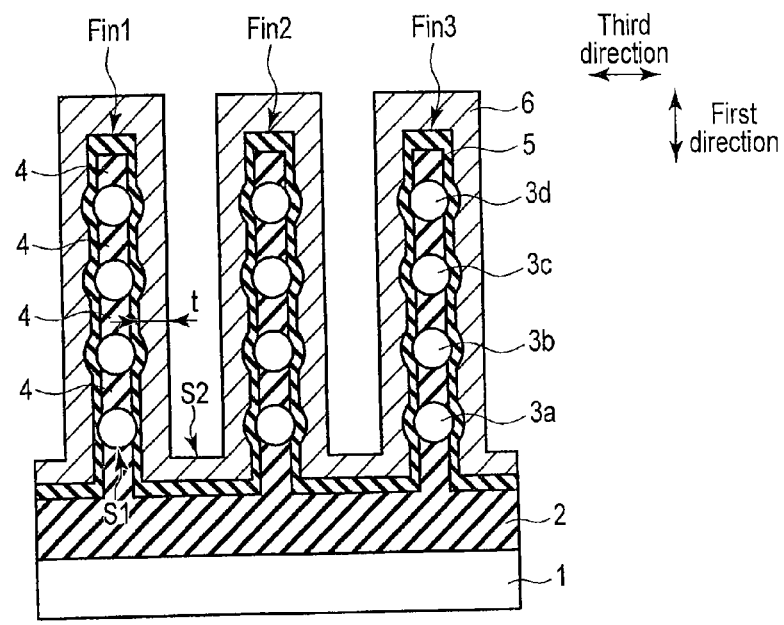

As shown in FIG. 10, semiconductor electrode layer 6 that does not fill the space between fin type stacked layer structures Fin1, Fin2, and Fin3 is formed on gate insulating layer structure 5. Here, thickness t of semiconductor electrode layer 6 is set so that semiconductor electrode layer 6 does not fill the space between fin type stacked layer structures Fin1, Fin2, and Fin3.

Between fin type stacked layer structures Fin1, Fin2, and Fin3, upper surface S2 of semiconductor electrode layer 6 in the first direction needs to be lower than lower surface S1 of lowermost active area layer 3a among active area layers 3a, 3b, 3c, and 3d. Therefore, insulating layer 2 is dug down in advance in the etching process shown in FIG. 7 and FIG. 8.

Figure 11:
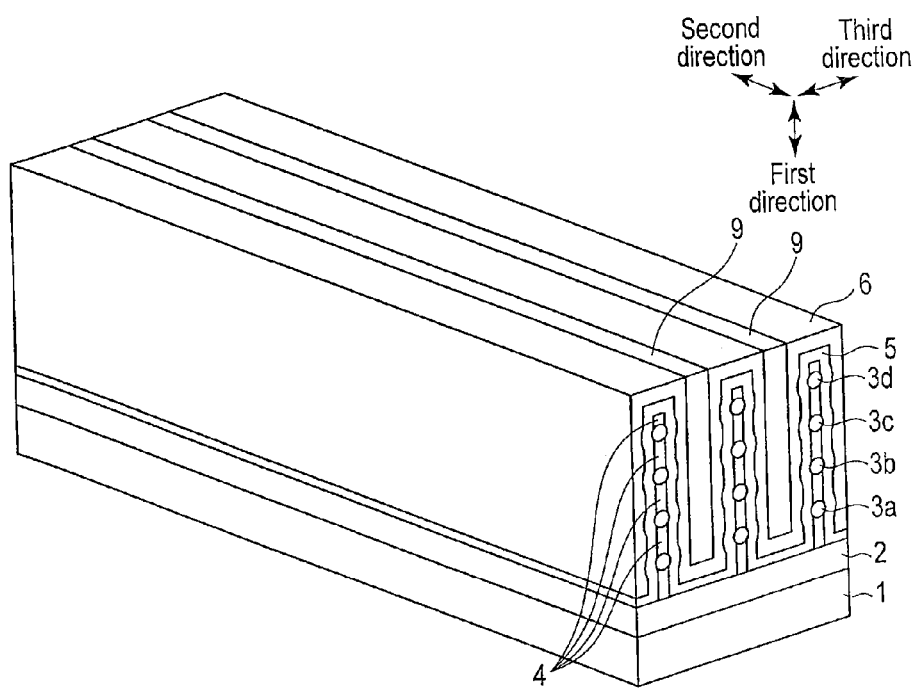
Figure 12:
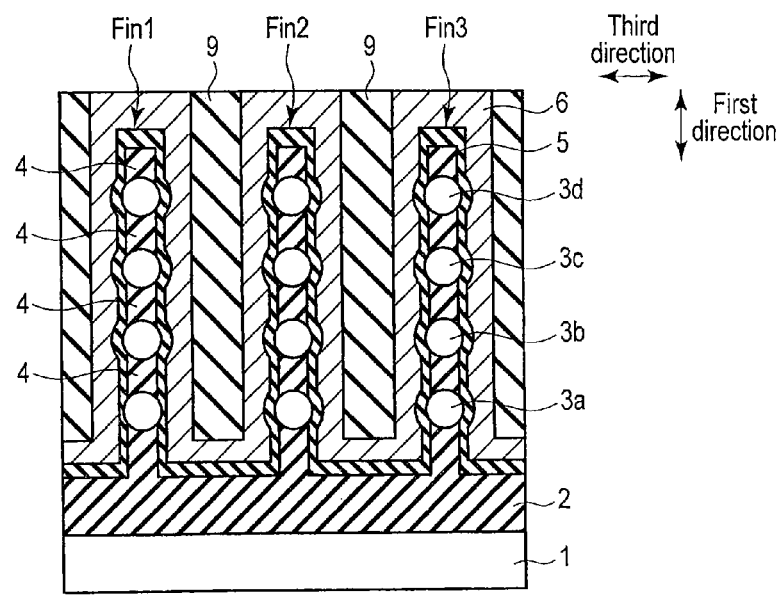

As shown in FIG. 11 and FIG. 12, first insulating layer 9 that fills the space between fin type stacked layer structures Fin1, Fin2, and Fin3 is formed on semiconductor electrode layer 6 as a sacrifice layer. First insulating layer 9 is only formed in the space between fin type stacked layer structures Fin1, Fin2, and Fin3 by chemical mechanical polishing (CMP).

The upper surface of first insulating layer 9 is planarized, and is formed to substantially correspond to the upper surface of semiconductor electrode layer 6.

Figure 13:
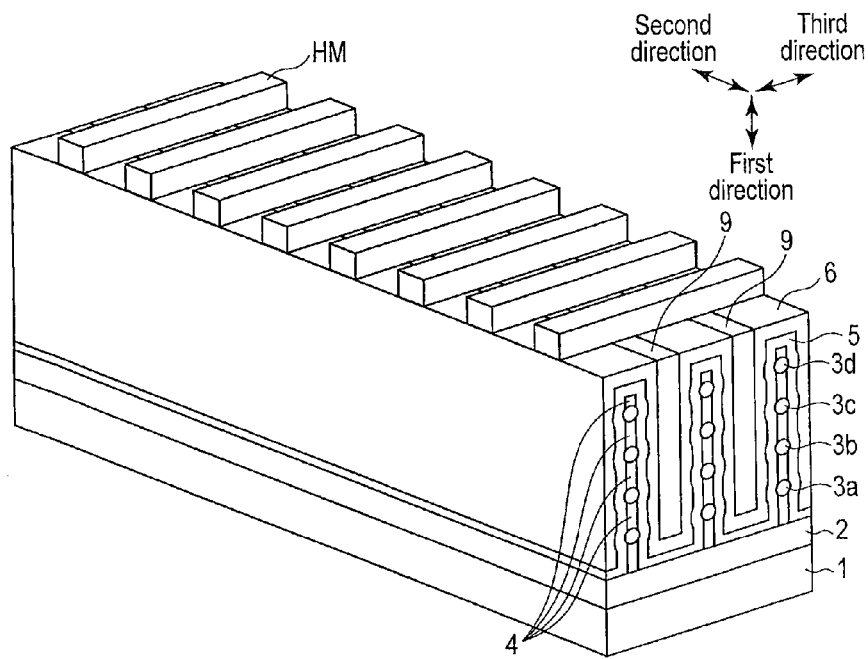

As shown in FIG. 13, hard mask layer HM is then formed on semiconductor electrode layer 6 and first insulating layer 9. Hard mask layer HM comprises an insulating layer such as a silicon oxide layer or a silicon nitride layer. Although an example of hard mask layer HM is described in this example, a resist layer may be used instead.

Figure 14:
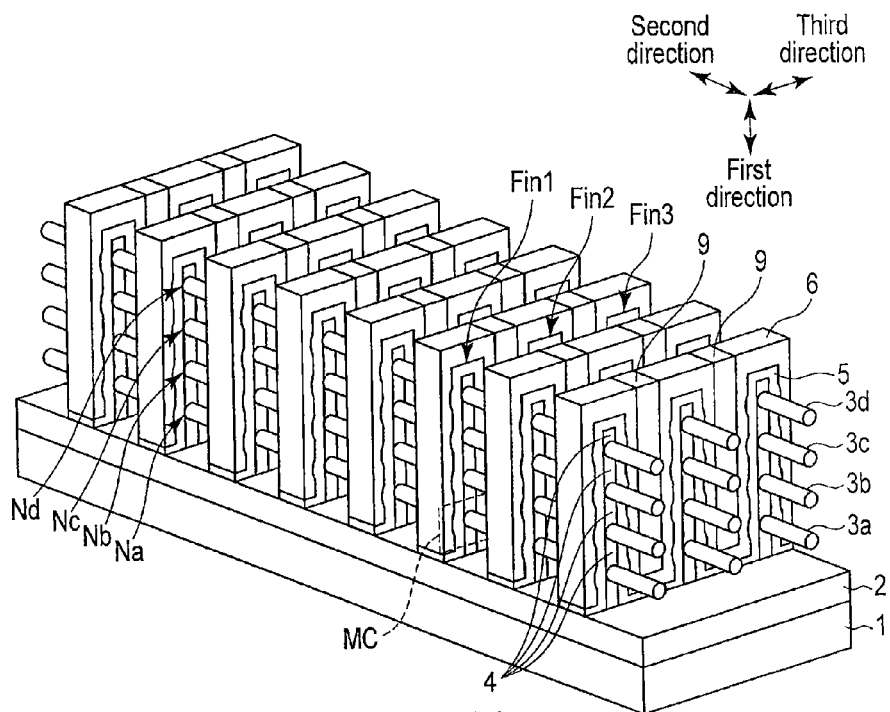

If hard mask layer HM is used as a mask to etch semiconductor electrode layer 6 and first insulating layer 9 by, for example, anisotropic dry etching, a line & space pattern comprising lines and spaces extending in the third direction is formed as shown in FIG. 14.

Although gate insulating layer structure 5 is removed in the spaces of the line & space pattern in this example, gate insulating layer structure 5 may be entirely or partly left in these spaces.

As shown in FIG. 14, in this example, insulating layers 2 and 4 between active area layers 3a, 3b, 3c, and 3d in the parts that are not covered with hard mask layer HM are removed by the anisotropic dry etching simultaneously with the etching of semiconductor electrode layer 6 and first insulating layer 9. However, insulating layers 2 and 4 between active area layers 3a, 3b, 3c, and 3d in the parts that are not covered with hard mask layer HM may be left instead.

Hard mask layer HM is then removed.

Figure 15:
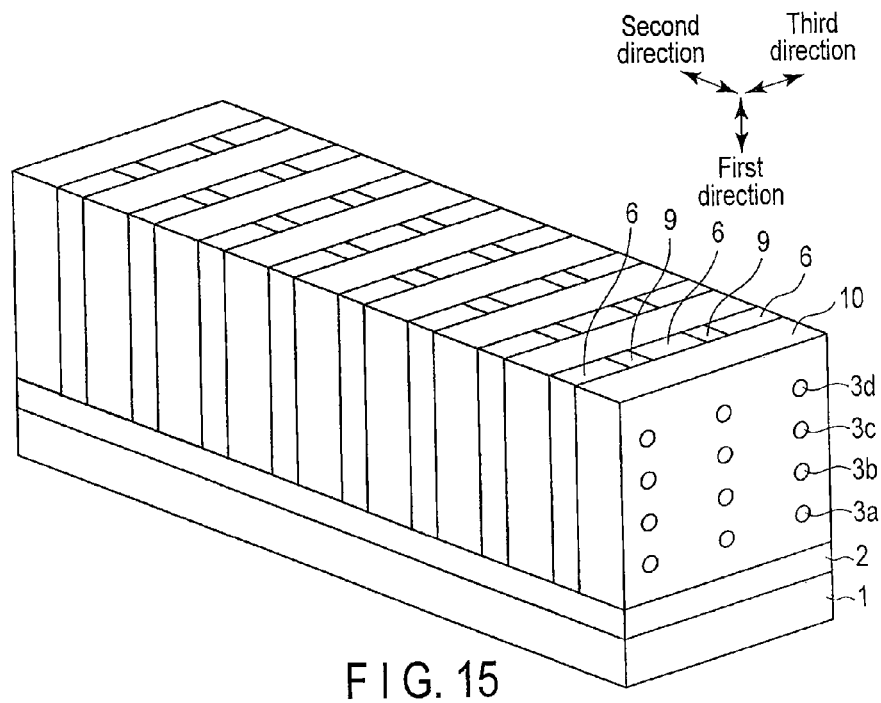

As shown in FIG. 15, the spaces of the line & space pattern formed in the step in FIG. 14 are then filled with second insulating layer 10 different from first insulating layer 9. For example, when one of first and second insulating layers 9 and 10 is a silicon oxide layer, the other of first and second insulating layers 9 and 10 can be a silicon nitride layer.

Here, the difference between first and second insulating layers 9 and 10 not only includes the difference of materials but also includes the difference of characteristics attributed to the difference of composition and density when the material is the same. For example, one of first and second insulating layers 9 and 10 can be high-density $SiO_2$ formed by a high-temperature process, and the other can be low-density $SiO_2$ formed by a low-temperature process.

Second insulating layer 10 is only formed in the space of the line & space pattern by, for example, chemical mechanical polishing (CMP). The upper surface of second insulating layer 10 is planarized, and is formed to substantially correspond to the upper surfaces of semiconductor electrode layer 6 and first insulating layer 9.

Figure 16:
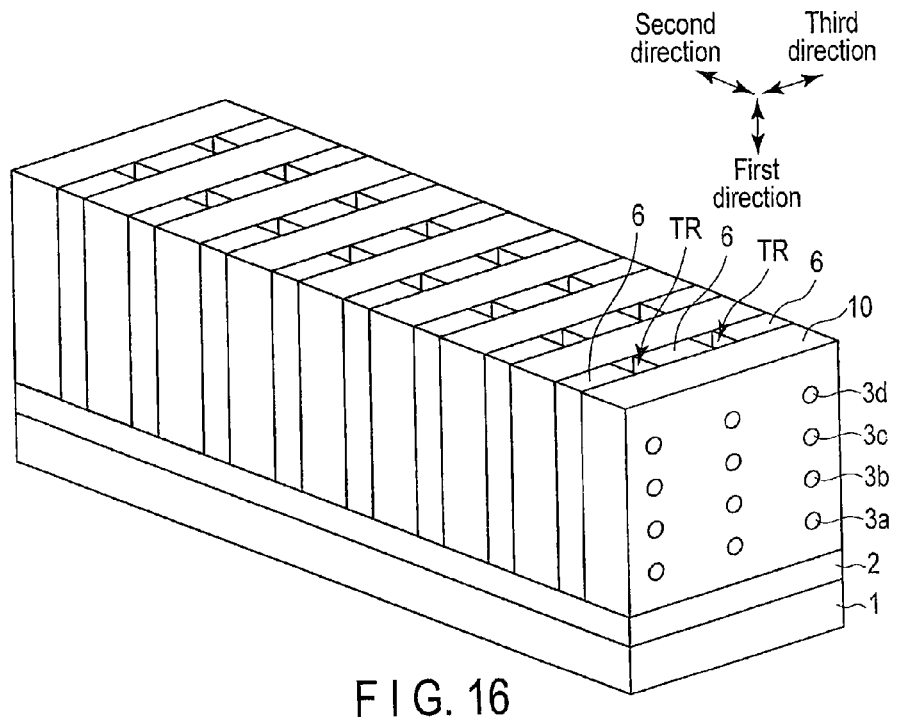
Figure 17:
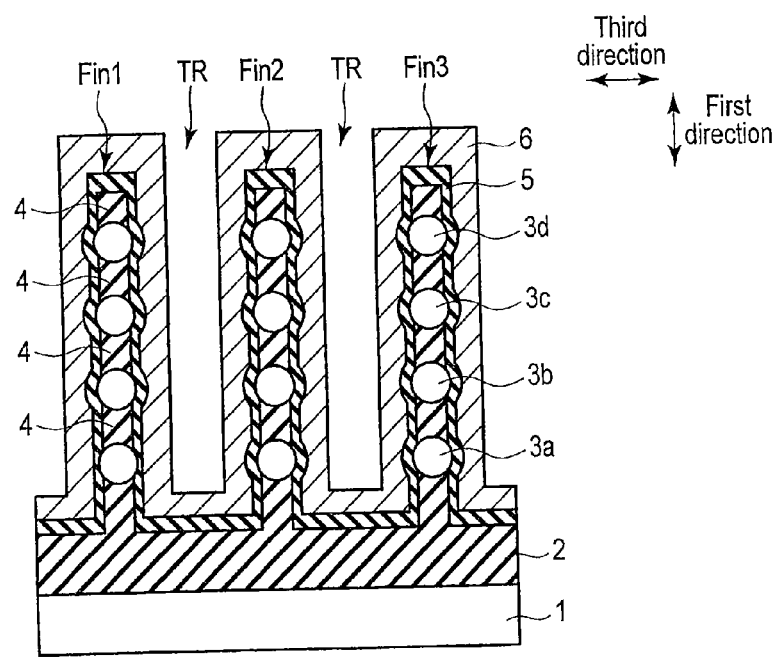

As shown in FIG. 16 and FIG. 17, first insulating layer 9 is then selectively removed, and trenches TR that expose semiconductor electrode layer 6 between fin type stacked layer structures Fin1, Fin2, and Fin3 are thereby formed in the lines of the line & space pattern, respectively.

The bottom surfaces of trenches TR are lower than the lower surface of lowermost active area layer 3a among active area layers 3a, 3b, 3c, and 3d.

When first insulating layer 9 is a silicon nitride layer, first insulating layer 9 can be selectively removed by the use of $H_3PO_4$.

Figure 18:
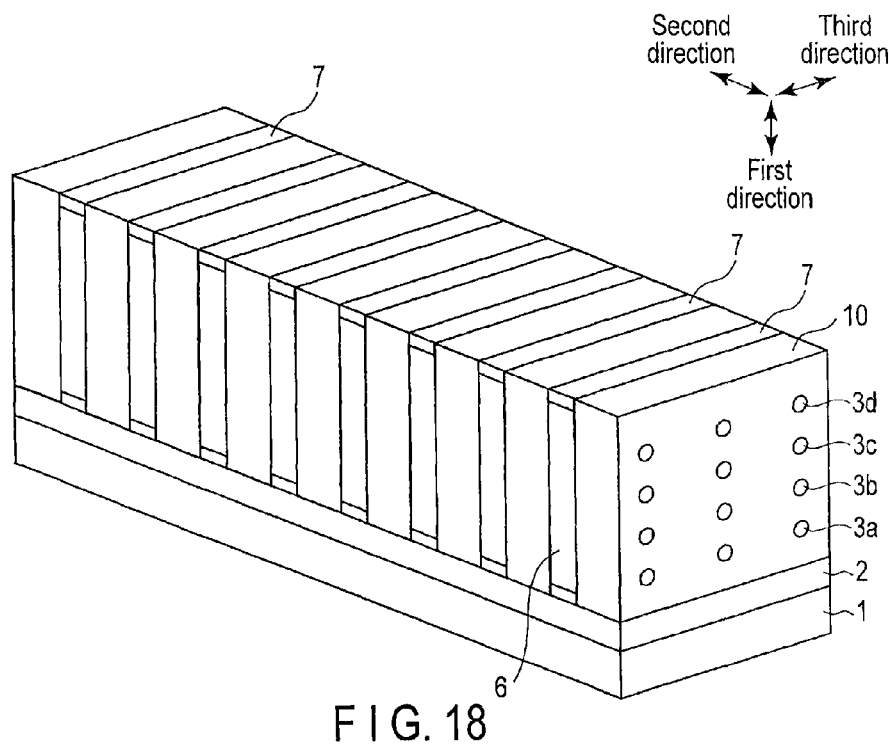
Figure 19:
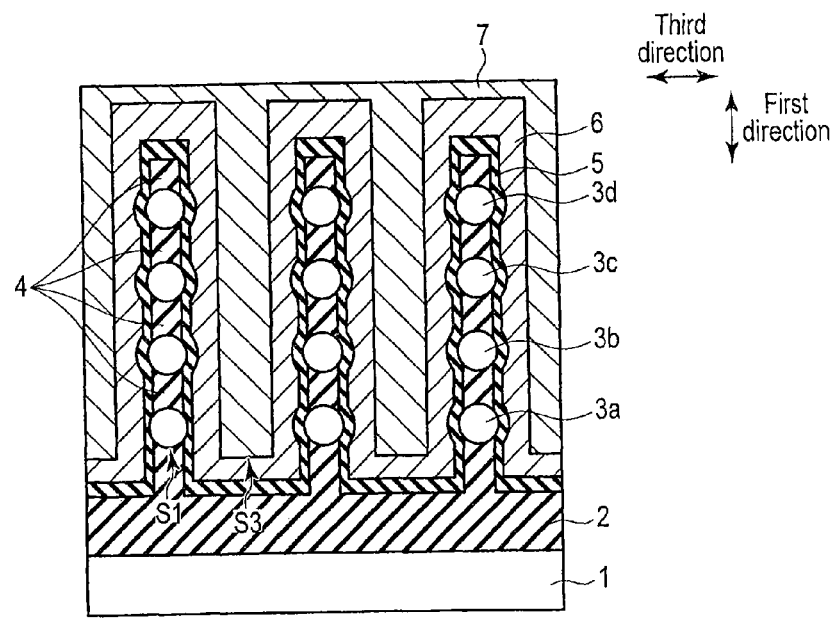

As shown in FIG. 18 and FIG. 19, metal layer 7 is then formed on semiconductor electrode layer 6.

Between fin type stacked layer structures Fin1, Fin2, and Fin3, lower surface S3 of metal layer 7 in the first direction is lower than lower surface S1 of lowermost active area layer 3a among active area layers 3a, 3b, 3c, and 3d.

Here, metal layer 7 may fill trenches TR shown in FIG. 16 and FIG. 17, or does not need to fill trenches TR shown in FIG. 16 and FIG. 17.

Semiconductor electrode layer 6 and metal layer 7 may be chemically reacted by a thermal treatment to partly or entirely change semiconductor electrode layer 6 into a metal compound layer (e.g. metal silicide layer). In this case, for example, unreacted metal layer 7 can be removed so that metal layer (metal compound layer) 7 will only remain on semiconductor electrode layer 6 as shown in FIG. 18 and FIG. 19.

When semiconductor electrode layer 6 is a silicon layer, a nickel layer, for example, can be used as metal layer 7 to form a low-resistance nickel silicide layer. When semiconductor electrode layer 6 is a germanium layer, a nickel layer, for example, can be used as metal layer 7 to form a low-resistance nickel germanide layer.

When the space between fin type stacked layer structures Fin1, Fin2, and Fin3 is not filled with the metal compound layer (silicide layer or germanide layer), a metal layer may be further formed on the metal compound layer, and the space between fin type stacked layer structures Fin1, Fin2, and Fin3 may be filled with the metal layer.

The structure shown in FIG. 1 to FIG. 3, FIG. 5, and FIG. 6 can be formed by the steps described above.

(Second Example)

A second example of a method of manufacturing the structure shown in FIG. 1 to FIG. 3, FIG. 5, and FIG. 6 is described.

First, as shown in FIG. 7 to FIG. 10, gate insulating layer structure 5 and semiconductor electrode layer 6 covering fin type stacked layer structures Fin1, Fin2, and Fin3 are formed by the steps described in the above first example. Here, as in the first example, thickness t of semiconductor electrode layer 6 is set so that semiconductor electrode layer 6 does not fill the space between fin type stacked layer structures Fin1, Fin2, and Fin3.

As shown in FIG. 20 and FIG. 21, first insulating layer 9 filling the space between fin type stacked layer structures Fin1, Fin2, and Fin3 is formed on semiconductor electrode layer 6 as a sacrifice layer.

First insulating layer 9 is formed, for example, to cover fin type stacked layer structures Fin1, Fin2, and Fin3 and fill the space between fin type stacked layer structures Fin1, Fin2, and Fin3. The upper surface of first insulating layer 9 is planarized by CMP.

Figure 22:
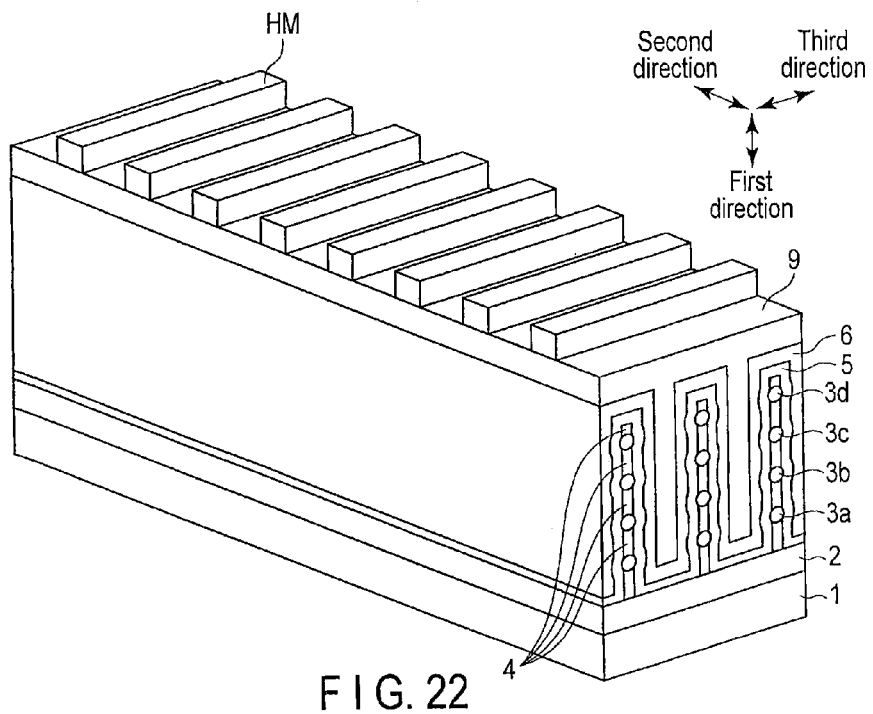

As shown in FIG. 22, hard mask layer HM is then formed on semiconductor electrode layer 6 and first insulating layer 9. Hard mask layer HM comprises an insulating layer such as a silicon oxide layer or a silicon nitride layer. Although an example of hard mask layer HM is described in this example, a resist layer may be used instead.

Figure 23:
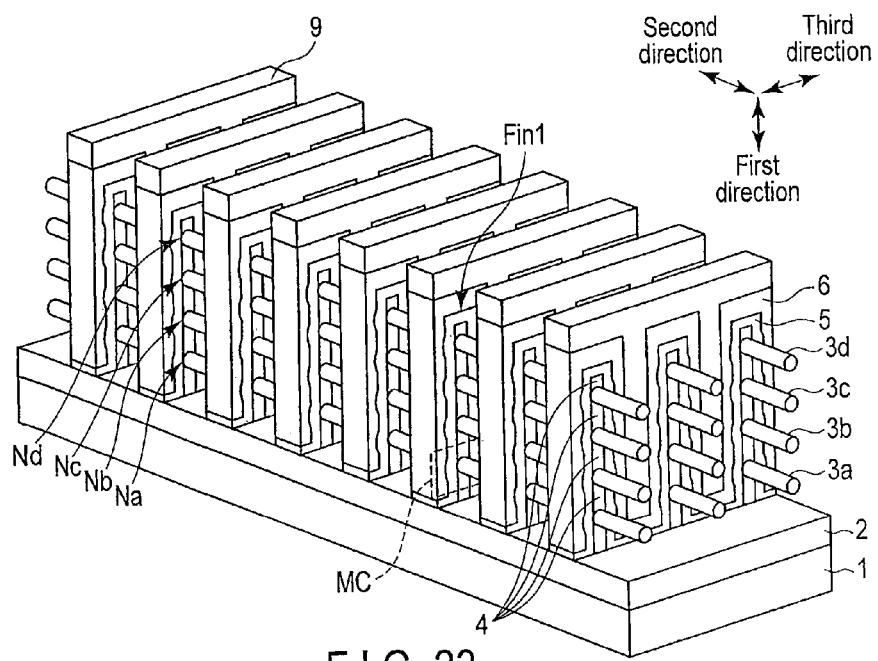

If hard mask layer HM is used as a mask to etch semiconductor electrode layer 6 and first insulating layer 9 by, for example, anisotropic dry etching, a line & space pattern comprising lines and spaces extending in the third direction is formed as shown in FIG. 23.

Although gate insulating layer structure 5 is removed in the spaces of the line & space pattern in this example as in the first example, gate insulating layer structure 5 may be entirely or partly left in these spaces.

As shown in FIG. 23, in this example, insulating layers 2 and 4 between active area layers 3a, 3b, 3c, and 3d in the parts that are not covered with hard mask layer HM are removed by the anisotropic dry etching simultaneously with the etching of semiconductor electrode layer 6 and first insulating layer 9. However, insulating layers 2 and 4 between active area layers 3a, 3b, 3c, and 3d in the parts that are not covered with hard mask layer HM may be left instead.

Hard mask layer HM is then removed.

Here, the difference between the first example and the second example is that first insulating layer 9 covers the entire upper surfaces of the lines of the line & space pattern. First insulating layer 9 may be removed in the end or may be left. That is, first insulating layer 9 is a sacrifice layer but can be left.

Figure 24:
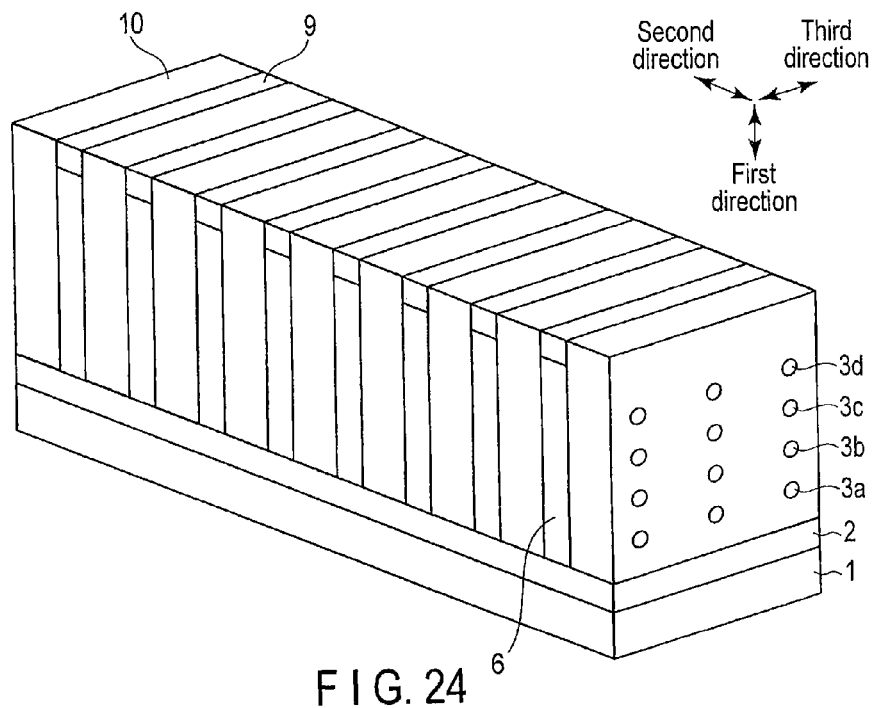

As shown in FIG. 24, the spaces of the line & space pattern formed in the step in FIG. 23 are filled with second insulating layer 10 different from first insulating layer 9. For example, when one of first and second insulating layers 9 and 10 is a silicon oxide layer, the other of first and second insulating layers 9 and 10 can be a silicon nitride layer.

Here, as in the first example, the difference between first and second insulating layers 9 and 10 not only includes the difference of materials but also includes the difference of characteristics attributed to the difference of composition and density when the material is the same.

Second insulating layer 10 is only formed in the space of the line & space pattern by, for example, CMP. The upper surface of second insulating layer 10 is planarized, and is formed to substantially correspond to the upper surface of first insulating layer 9.

Figure 25:
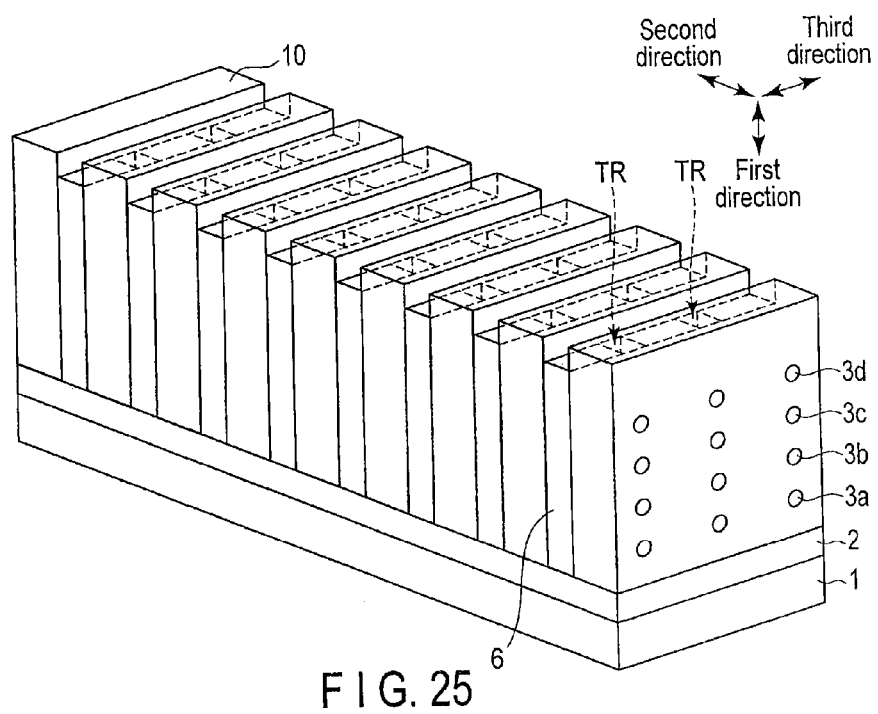

As shown in FIG. 25 and FIG. 26, first insulating layer 9 is then selectively removed, and trenches TR that expose semiconductor electrode layer 6 between fin type stacked layer structures Fin1, Fin2, and Fin3 are thereby formed in the lines of the line & space pattern, respectively.

The bottom surfaces of trenches TR are lower than the lower surface of lowermost active area layer 3a among active area layers 3a, 3b, 3c, and 3d.

When first insulating layer 9 is a silicon nitride layer, first insulating layer 9 can be selectively removed by the use of $H_3PO_4$.

As shown in FIG. 27 and FIG. 28, metal layer 7 is then formed on semiconductor electrode layer 6. Metal layer 7 can be only left in trenches TR shown in FIG. 25 and FIG. 26 by, for example, sputtering and CMP.

Here, metal layer 7 may fill trenches TR shown in FIG. 25 and FIG. 26, or does not need to fill trenches TR shown in FIG. 25 and FIG. 26.

Semiconductor electrode layer 6 and metal layer 7 may be chemically reacted by a thermal treatment to partly or entirely change semiconductor electrode layer 6 into a metal compound layer (e.g. metal silicide layer). In this case, for example, unreacted metal layer 7 may be removed or may be left. When unreacted metal layer 7 is removed, a metal layer may be further formed in the removed part.

When semiconductor electrode layer 6 is a silicon layer, a nickel layer, for example, can be used as metal layer 7 to form a low-resistance nickel silicide layer. When semiconductor electrode layer 6 is a germanium layer, a nickel layer, for example, can be used as metal layer 7 to form a low-resistance nickel germanide layer.

When the space between fin type stacked layer structures Fin1, Fin2, and Fin3 is not filled with the metal compound layer (silicide layer or germanide layer), a metal layer is further formed on the metal compound layer, and the space between fin type stacked layer structures Fin1, Fin2, and Fin3 may be filled with the metal layer.

The structure shown in FIG. 1 to FIG. 3, FIG. 5, and FIG. 6 can be formed by the steps described above.

(Third Example)

A third example of a method of manufacturing the structure shown in FIG. 1 to FIG. 3, FIG. 5, and FIG. 6 is described.

First, as shown in FIG. 7 to FIG. 10, gate insulating layer structure 5 and semiconductor electrode layer 6 covering fin type stacked layer structures Fin1, Fin2, and Fin3 are formed by the steps described in the above first example. Here, as in the first example, thickness t of semiconductor electrode layer 6 is set so that semiconductor electrode layer 6 does not fill the space between fin type stacked layer structures Fin1, Fin2, and Fin3.

Figure 30:
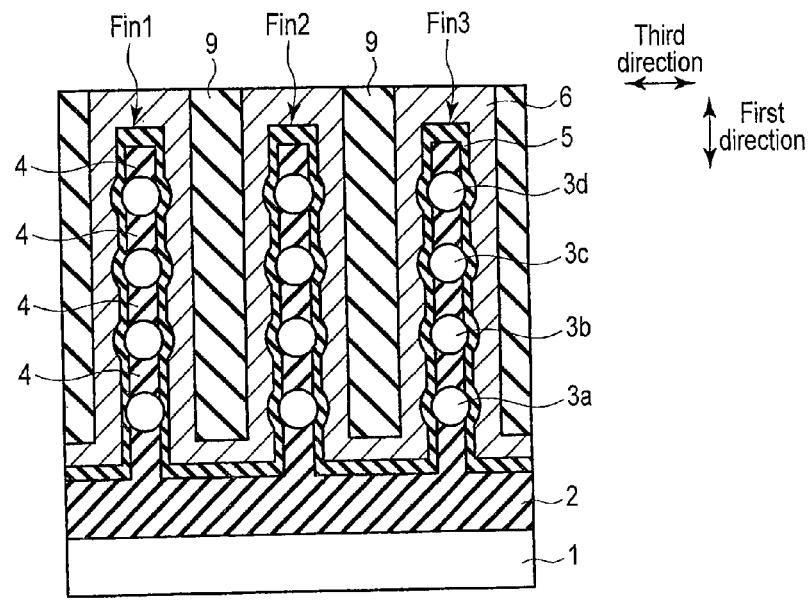

As shown in FIG. 29 and FIG. 30, first insulating layer 9 filling the space between fin type stacked layer structures Fin1, Fin2, and Fin3 is formed on semiconductor electrode layer 6 as a sacrifice layer. First insulating layer 9 is formed by, for example, CMP to only fill the space between fin type stacked layer structures Fin1, Fin2, and Fin3.

Figure 31:
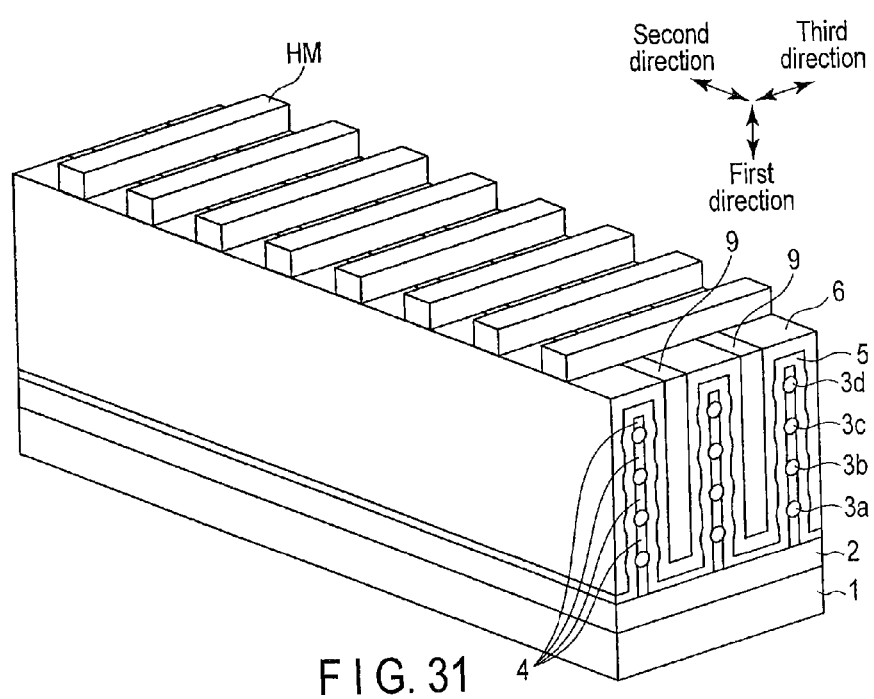

As shown in FIG. 31, hard mask layer HM is then formed on semiconductor electrode layer 6 and first insulating layer 9. Hard mask layer HM comprises an insulating layer such as a silicon oxide layer or a silicon nitride layer.

If hard mask layer HM is used as a mask to etch semiconductor electrode layer 6 and first insulating layer 9 by, for example, anisotropic dry etching, a line & space pattern comprising lines and spaces extending in the third direction is formed as shown in FIG. 32.

Here, the difference between the first example and the third example is that hard mask layer HM is not removed and is left as it is.

Although gate insulating layer structure 5 is removed in the spaces of the line & space pattern in this example as in the first example, gate insulating layer structure 5 may be entirely or partly left in these spaces.

As shown in FIG. 32, in this example, insulating layers 2 and 4 between active area layers 3a, 3b, 3c, and 3d in the parts that are not covered with hard mask layer HM are removed by the anisotropic dry etching simultaneously with the etching of semiconductor electrode layer 6 and first insulating layer 9. However, insulating layers 2 and 4 between active area layers 3a, 3b, 3c, and 3d in the parts that are not covered with hard mask layer HM may be left instead.

As shown in FIG. 33, the spaces of the line & space pattern formed in the step in FIG. 32 are filled with second insulating layer 10 different from first insulating layer 9 and hard mask layer HM.

Here, the difference between second insulating layer 10 and first insulating layer 9 as well as hard mask layer HM not only includes the difference of materials but also includes the difference of characteristics attributed to the difference of composition and density when the material is the same.

Second insulating layer 10 is only formed in the space of the line & space pattern by, for example, CMP. The upper surface of second insulating layer 10 is planarized, and is formed to substantially correspond to the upper surface of hard mask layer HM.

Figure 34:
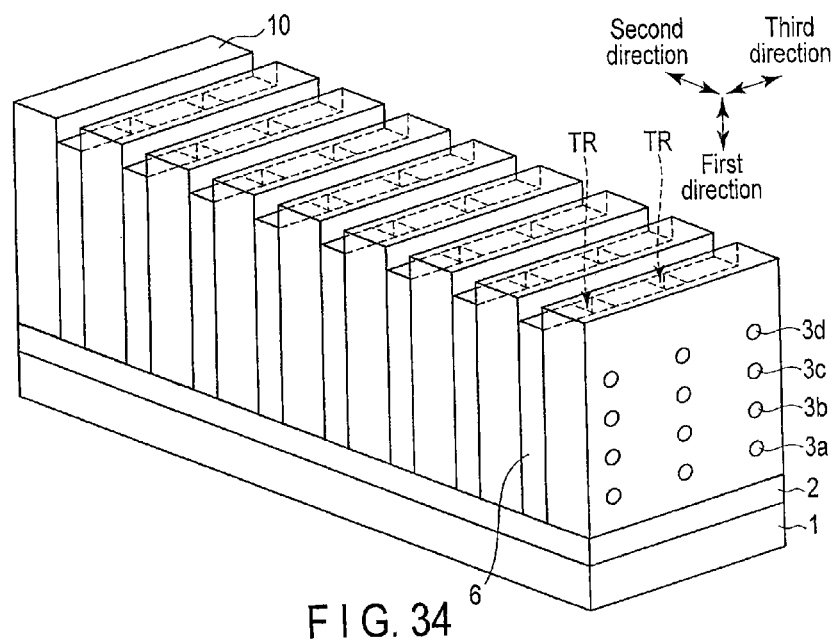
Figure 35:
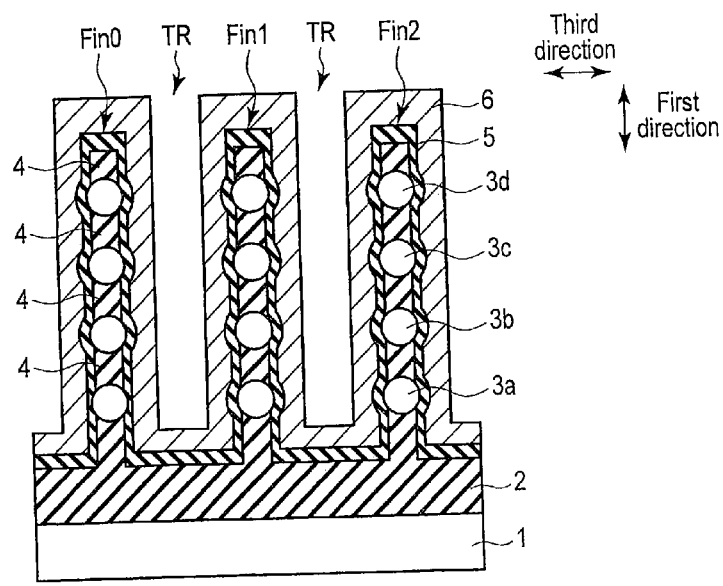

As shown in FIG. 34 and FIG. 35, first insulating layer 9 and hard mask layer HM are selectively removed, and trenches TR that expose semiconductor electrode layer 6 between fin type stacked layer structures Fin1, Fin2, and Fin3 are thereby formed in the lines of the line & space pattern, respectively.

The bottom surfaces of trenches TR are lower than the lower surface of lowermost active area layer 3a among active area layers 3a, 3b, 3c, and 3d.

When both first insulating layer 9 and hard mask layer HM are silicon nitride layers, first insulating layer 9 and hard mask layer HM can be selectively removed by the use of $H_3PO_4$.

As shown in FIG. 36 and FIG. 37, metal layer 7 is then formed on semiconductor electrode layer 6. Metal layer 7 can be only left in trenches TR shown in FIG. 34 and FIG. 35 by, for example, sputtering and CMP.

Here, metal layer 7 may fill trenches TR shown in FIG. 34 and FIG. 35, or does not need to fill trenches TR shown in FIG. 34 and FIG. 35.

Semiconductor electrode layer 6 and metal layer 7 may be chemically reacted by a thermal treatment to partly or entirely change semiconductor electrode layer 6 into a metal compound layer (e.g. metal silicide layer). In this case, for example, unreacted metal layer 7 may be removed or may be left. When unreacted metal layer 7 is removed, a metal layer may be further formed in the removed part.

When semiconductor electrode layer 6 is a silicon layer, a nickel layer, for example, can be used as metal layer 7 to form a low-resistance nickel silicide layer. When semiconductor electrode layer 6 is a germanium layer, a nickel layer, for example, can be used as metal layer 7 to form a low-resistance nickel germanide layer.

When the space between fin type stacked layer structures Fin1, Fin2, and Fin3 is not filled with the metal compound layer (silicide layer or germanide layer), a metal layer is further formed on the metal compound layer, and the space between fin type stacked layer structures Fin1, Fin2, and Fin3 may be filled with the metal layer.

The structure shown in FIG. 1 to FIG. 3, FIG. 5, and FIG. 6 can be formed by the steps described above.

(4) Other

FIG. 38 to FIG. 40 show a structure example of the gate electrode (word line) of the transistor formed according to the embodiment described above.

Here, the transistor includes memory cell MC and select transistor ST.

FIG. 38 shows an example of the gate electrode comprising semiconductor electrode layer (e.g. polysilicon layer) 6 and metal layer 7. FIG. 39 shows an example of the gate electrode comprising semiconductor electrode layer (e.g. polysilicon layer) 6A and metal silicide layer 6B. FIG. 40 shows an example of the gate electrode comprising metal silicide layer (full silicide) 6B.

In the examples shown in FIG. 39 and FIG. 40, a metal layer may be further formed on metal silicide layer 6B. When the space between fin type stacked layer structures Fin1, Fin2, and Fin3 is not filled with these conductive materials, the space between fin type stacked layer structures Fin1, Fin2, and Fin3 may be filled with an insulating layer.

2. Second Embodiment (1) Structure

FIG. 41 is a perspective view of a nonvolatile semiconductor memory device. FIG. 42 is a plan view of FIG. 41. FIG. 43 is a sectional view taken along the line XLIII-XLIII in FIG. 42.

When compared with the first embodiment described above, the second embodiment is characterized in that a gate electrode of a transistor (memory cell MC or select transistor ST) is made of a metal layer or a metal compound layer. That is, in the present embodiment, the gate electrode of the transistor does not include any semiconductor electrode layer.

According to this structure, the gate electrode (word line) can be only made of a low-resistance material, so that high integration and high performance can be simultaneously obtained in a VG type semiconductor memory structure. As obvious from a manufacturing method described later, this structure can be accurately formed in a short time without the patterning (etching that uses a mask) of the metal layer or metal compound layer.

Semiconductor substrate 1 is, for example, a silicon substrate. Insulating film 2 is, for example, a silicon oxide layer, and is disposed on semiconductor substrate 1.

Fin type stacked layer structures Fin1, Fin2, and Fin3 are disposed on insulating film 2. Each of fin type stacked layer structures Fin1, Fin2, and Fin3 has (four, in this example) active area layers 3a, 3b, 3c, and 3d stacked, for example, in a first direction perpendicular to the surface of semiconductor substrate 1.

Fin type stacked layer structures Fin1, Fin2, and Fin3 extend in a second direction parallel to the surface of semiconductor substrate 1, and are arranged in a third direction that intersects with the first and second directions.

Active area layers 3a, 3b, 3c, and 3d are, for example, semiconductor layers (e.g. monocrystalline silicon layer). Active area layers 3a, 3b, 3c, and 3d are insulated from one another by, for example, insulating layers (e.g. silicon oxide layers) 4 in parts where elements (e.g. memory cells and transistors) are formed, and are insulated from one another by cavities in other parts.

However, active area layers 3a, 3b, 3c, and 3d may be insulated from one another by insulating layers 4 in parts other than the parts where the elements are formed. That is, active area layers 3a, 3b, 3c, and 3d have only to be insulated from one another, and their insulating structure (e.g. the insulating layers and the cavities) is not limited.

Although four active area layers 3a, 3b, 3c, and 3d are stacked in this example, the number of active area layers in fin type stacked layer structures Fin1, Fin2, and Fin3 is not limited thereto.

A larger number of active area layers in fin type stacked layer structures Fin1, Fin2, and Fin3 is preferable for the increase of memory capacity in the nonvolatile semiconductor memory device.

The elements (e.g. the memory cells and select transistors) are arranged on the side surfaces of active area layers 3a, 3b, 3c, and 3d in the third direction. For example, memory strings Na, Nb, Nc, and Nd are arranged on active area layers 3a, 3b, 3c, and 3d. Each of memory strings Na, Nb, Nc, and Nd includes memory cells MC connected in series in the second direction.

Memory strings Na, Nb, Nc, and Nd may comprise two select transistors ST respectively connected to both ends of memory cells MC.

For example, as shown in FIG. 5, memory cell MC has gate insulating layer structure 5 disposed on the side surfaces of active area layers 3a, 3b, 3c, and 3d in the third direction. Gate insulating layer structure 5 has already been described in the first embodiment, and is therefore not described here.

Metal layer (including a metal compound layer) 7 extends in the first direction on the side surfaces of fin type stacked layer structures Fin1, Fin2, and Fin3 in the third direction. However, when viewed from above fin type stacked layer structures Fin1, Fin2, and Fin3, metal layer 7 extends in the third direction as a whole. That is, for example, as obvious from FIG. 43, metal layer 7 has a comb shape in a two-dimensional plane including the first and third directions.

Metal layer 7 may fill space W between fin type stacked layer structures Fin1, Fin2, and Fin3 as shown in FIG. 43, or does not need to fill the space W between fin type stacked layer structures Fin1, Fin2, and Fin3 as shown in FIG. 44.

In the latter case, as shown in FIG. 44, the space W between fin type stacked layer structures Fin1, Fin2, and Fin3 is filled with insulating layer 8 on metal layer 7.

In FIG. 44, insulating layer 8 may be omitted, and space W between fin type stacked layer structures Fin1, Fin2, and Fin3 may be a cavity.

Metal layer 7 functions as, for example, word line WL.

Here, between fin type stacked layer structures Fin1, Fin2, and Fin3, the lower surface of metal layer 7 is lower than the lower surface of lowermost active area layer 3a among active area layers 3a, 3b, 3c, and 3d.

This can eliminate the variation of signal delay time in memory cells MC within fin type stacked layer structures Fin1, Fin2, and Fin3, and improve the performance of the whole device. This advantageous effect is more significant, for example, when the number of active area layers in fin type stacked layer structures Fin1, Fin2, and Fin3 is larger and when fin type stacked layer structures Fin1, Fin2, and Fin3 are higher.

Thus, according to the present embodiment, high integration and high performance can be simultaneously obtained in a VG type three-dimensional semiconductor memory structure.

A new process is also suggested below, and this process makes it possible to obtain, without the patterning (etching that uses a mask) of metal layer 7, the structure shown in FIG. 41 to FIG. 44, that is, even the structure in which between fin type stacked layer structures Fin1, Fin2, and Fin3, the lower surface of metal layer 7 is lower than the lower surface of lowermost active area layer 3a among active area layers 3a, 3b, 3c, and 3d.

(2) Material Examples

As regards the examples of materials that constitute the elements of the structure shown in FIG. 41 to FIG. 44, the materials described in connection with the material examples in the first embodiment can be used, and are therefore not described here.

(3) Manufacturing Method

An example of a method of manufacturing the structure shown in FIG. 41 to FIG. 44 is described.

First, as shown in FIG. 45, first-conductivity-type (e.g. p-type) semiconductor substrate (e.g. silicon substrate) 1 having, for example, a plane direction (100) and a specific resistance of 10 to 20 Ωcm is prepared. On this semiconductor substrate 1, a stacked layer structure comprising insulating layers (e.g. silicon oxide layers) 2 and 4 and active area layers (e.g. monocrystalline silicon) 3a, 3b, 3c, and 3d is formed.

For example, a resist pattern is then used as a mask to etch the stacked layer structure. Thereby, fin type stacked layer structures Fin1, Fin2, and Fin3 extending in the second direction and arranged in the third direction are formed. The resist pattern is then removed.

Fin type stacked layer structures Fin1, Fin2, and Fin3 may be patterned by using a hard mask layer (e.g. silicon nitride layer or silicon oxide layer) as a mask. In this case, fin type stacked layer structures Fin1, Fin2, and Fin3 may include the hard mask layer (e.g. uppermost layer).

Gate insulating layer structure 5 covering fin type stacked layer structures Fin1, Fin2, and Fin3 is then formed. For example, as shown in FIG. 5, gate insulating layer structure 5 has three-layer structure of insulating layer 5a, storage layer 5b, and insulating layer 5c.

Here, the thickness of gate insulating layer structure 5 is set so that gate insulating layer structure 5 does not fill the space between fin type stacked layer structures Fin1, Fin2, and Fin3.

The thickness of gate insulating layer structure is also set so that between fin type stacked layer structures Fin1, Fin2, and Fin3, upper surface S4 of gate insulating layer structure 5 in the first direction is lower than lower surface S1 of lowermost active area layer 3a among active area layers 3a, 3b, 3c, and 3d.

Figure 46:
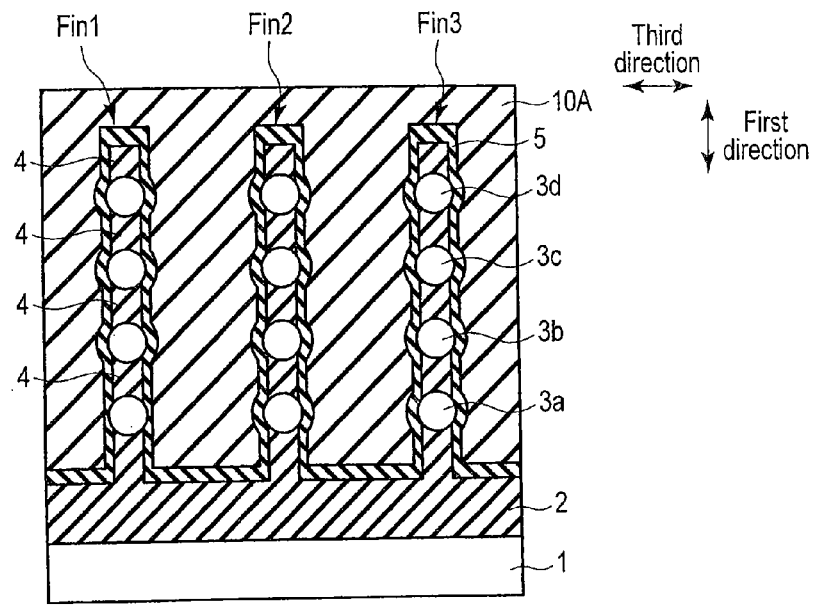

As shown in FIG. 46, first insulating layer 10A filling the space between fin type stacked layer structures Fin1, Fin2, and Fin3 is formed on gate insulating layer structure 5 as a sacrifice layer. The upper surface of first insulating layer 10A is planarized by, for example, CMP.

Figure 47:
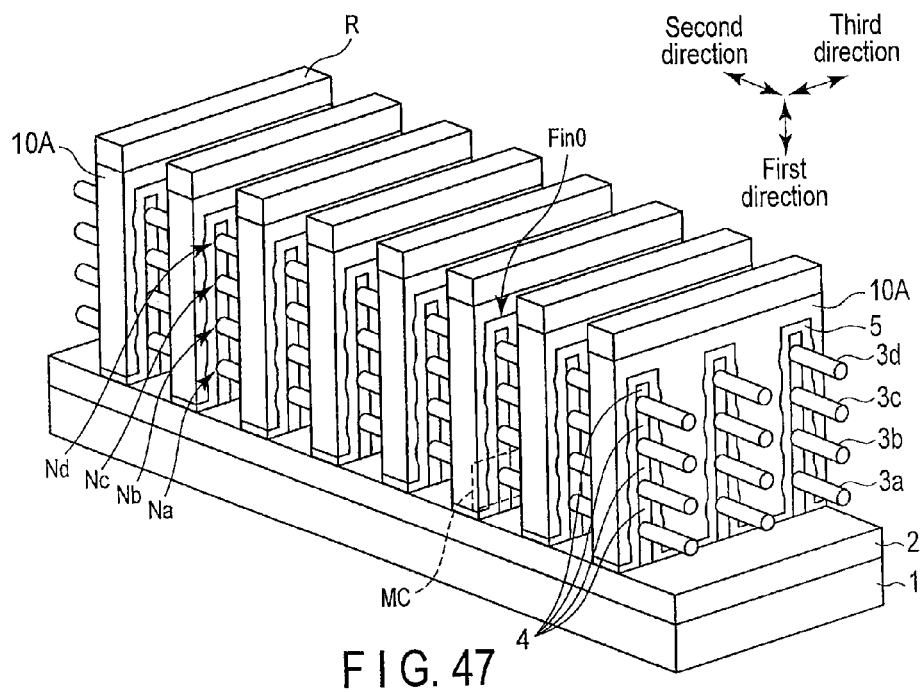

As shown in FIG. 47, resist layer R is formed on first insulating layer 10A. If resist layer R is then used as a mask to etch first insulating layer 10A by, for example, anisotropic dry etching, a line & space pattern comprising lines and spaces extending in the third direction is formed.

Although gate insulating layer structure 5 is removed in the spaces of the line & space pattern here in this example, gate insulating layer structure 5 may be entirely or partly left in these spaces.

In this example, insulating layers 2 and 4 between active area layers 3a, 3b, 3c, and 3d in the parts that are not covered with resist layer R are removed by the anisotropic dry etching simultaneously with the etching of first insulating layer 10A. However, insulating layers 2 and 4 between active area layers 3a, 3b, 3c, and 3d in the parts that are not covered with resist layer R may be left instead.

Resist layer R is then removed.

As shown in FIG. 48, the spaces of the line & space pattern formed in the step in FIG. 47 are filled with second insulating layer 10B different from first insulating layer 10A. For example, when one of first and second insulating layers 10A and 10B is a silicon oxide layer, the other of first and second insulating layers 10A and 10B can be a silicon nitride layer.

Here, the difference between first and second insulating layers 10A and 10B not only includes the difference of materials but also includes the difference of characteristics attributed to the difference of composition and density when the material is the same. For example, one of first and second insulating layers 10A and 10B can be high-density $SiO_2$ formed by a high-temperature process, and the other can be low-density $SiO_2$ formed by a low-temperature process.

Second insulating layer 10B is only formed in the space of the line & space pattern by, for example, CMP. The upper surface of second insulating layer 10B is planarized, and is formed to substantially correspond to the upper surface of first insulating layer 10A.

As shown in FIG. 49 and FIG. 50, first insulating layer 10A is selectively removed, and trenches TR that expose gate insulating layer structure 5 between fin type stacked layer structures Fin1, Fin2, and Fin3 are thereby formed in the lines of the line & space pattern, respectively.

The bottom surfaces of trenches TR are lower than the lower surface of lowermost active area layer 3a among active area layers 3a, 3b, 3c, and 3d.

When first insulating layer 10A is a silicon nitride layer, first insulating layer 10A can be selectively removed by the use of $H_3PO_4$.

As shown in FIG. 51 and FIG. 52, metal layer 7 is then formed on gate insulating layer structure 5. Metal layer 7 can be only left in trenches TR shown in FIG. 49 and FIG. 50 by, for example, sputtering and CMP.

Between fin type stacked layer structures Fin1, Fin2, and Fin3, lower surface S5 of metal layer 7 in the first direction is lower than lower surface S1 of lowermost active area layer 3a among active area layers 3a, 3b, 3c, and 3d.

Here, metal layer 7 may fill trenches TR shown in FIG. 49 and FIG. 50, or does not need to fill trenches TR shown in FIG. 49 and FIG. 50.

The structure shown in FIG. 41 to FIG. 44 can be formed by the steps described above.

(4) Other

The second embodiment also includes a structure in which the gate electrode is metal silicide layer (metal compound layer) 6B shown in FIG. 40.

Although the insulating layer is used as the sacrifice layer in the embodiments described above, some other material can also be used. For example, a semiconductor material such as SiGe can be used. When the semiconductor electrode layer includes Si, a layer that includes SiGe higher in etching rate than Si can be the sacrifice layer.

Furthermore, the stacked layer structure is not limited to the stacked layer structure of the semiconductor electrode layer and the metal layer. It is also possible to form a conductive layer of, for example, a metal having a desired work function on a gate insulating layer structure, and stack, on this conductive layer, a conductive layer of, for example, a metal having lower resistivity.

3. Application

The application of the above first and second embodiments to, for example, a vertical gate ladder-bit cost scalable memory (VLB) is described.

The VLB is classified into a vertical gate-floating gate type (VG-FG type) in which a charge storage layer is a floating gate electrode which is electrically floating, and a vertical gate-Si/oxide/nitride/oxide/Si type (VG-SONOS type) in which a charge storage layer is a charge trap insulating layer which traps a charge.

FIG. 1 and FIG. 2 show a perspective view of the VLB.

Each of fin type stacked layer structures Fin1, Fin2, and Fin3 has active area layers 3a, 3b, and 3c. Although four active area layers are stacked in the above first and second embodiments, three active area layers are stacked in this example.

Memory strings Na, Nb, and Nc formed on active area layers 3a, 3b, and 3c correspond to memory strings Na, Nb, Nc, and Nd in the above first and second embodiments.

In this example, memory cell MC comprises gate insulating layer structure 5, semiconductor electrode layer 6, and metal layer 7. As with memory cell MC, assist gate transistor AGT serving as select transistor ST also comprises gate insulating layer structure 5, semiconductor electrode layer 6, and metal layer 7. Metal layer 7 of memory cell MC functions as word line WL. Metal layer 7 of assist gate transistor AGT is connected to assist gate line AGL.

Both ends of each of fin type stacked layer structures Fin1, Fin2, and Fin3 in the second direction are connected to beams 21a and 21b extending in the third direction. Beams 21a and 21b have active area layers 3a, 3b, and 3c as fin type stacked layer structures Fin1, Fin2, and Fin3.

However, active area layers 3a, 3b, and 3c of beams 21a and 21b have impurity region 23 for resistance reduction.

A function of selecting one of memory strings Na, Nb, and Nc is added to the ends of beams 21a and 21b in the third direction.

For example, in the example shown in FIG. 53, the ends of beams 21a and 21b in the third direction are stepped. Contact plug 22 is independently connected to active area layers 3a, 3b, and 3c in beams 21a and 21b.

Active areas 3a, 3b, and 3c in beam 21a are connected to source line SL via contact plug 22. Active area layers 3a, 3b, and 3c in beam 21c are connected to bit line BL via contact plug 22.

For example, in the example shown in FIG. 54, the ends of beams 21a and 21b in the third direction has common semiconductor layer 24 connected to active areas 3a, 3b, and 3c, and layer select transistors LSTa, LSTb, and LSTc. Common semiconductor layer 24 is connected to source line SL or bit line BL via contact plug 22.

Layer select transistors LSTa, LSTb, and LSTc have select gate electrode SG. Layer select transistor LSTa has impurity region 25a in a part corresponding to lowermost active area 3a. Layer select transistor LSTb has impurity region 25b in a part corresponding to active area 3b. Layer select transistor LSTc has impurity region 25c in a part corresponding to uppermost active area 3c.

Thus, one of memory strings Na, Nb, and Nc (one semiconductor layer in fin type stacked layer structures Fin1, Fin2, and Fin3) can be selected.

4. Conclusion

According to the embodiments, it is possible to provide a nonvolatile semiconductor memory device and a manufacturing method which enable both high integration and high performance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a nonvolatile semiconductor memory device, the method comprising:
    forming first and second stacked layer structures each comprising active area layers, the active area layers stacked in a first direction and extending in a second direction which intersects with the first direction, the first and second stacked layer structures arranged in a third direction which intersects with the first and second directions;
    forming a gate insulating layer structure covering the first and second stacked layer structures;
    forming a first conductive layer on the gate insulating layer structure, a space between the first and second stacked layer structures not filled with the first conductive layer;
    forming a sacrifice layer on the first conductive layer, the space between the first and second stacked layer structures filled with the sacrifice layer;
    patterning the first conductive layer and the sacrifice layer with a line & space pattern comprising lines and spaces extending in the third direction;
    filling an insulating layer in the spaces of the line & space pattern, the insulating layer having an etching characteristic different from the sacrifice layer;
    forming trenches in the lines of the line & space pattern by removing the sacrifice layer selectively, the trenches exposing the first conductive layer between the first and second stacked layer structures; and
    forming a second conductive layer on the first conductive layer in the trenches.

2. The method of claim 1,
wherein the first conductive layer is a semiconductor electrode layer, the second conductive layer is a metal layer, and at least one part of the semiconductor electrode layer changes to a metal compound layer by reacting the semiconductor electrode layer and the metal layer.

3. The method of claim 2, further comprising:
forming a metal layer on the metal compound layer after forming the metal compound layer.

4. The method of claim 1,
wherein an upper surface in the first direction of the first conductive layer is lower than a lower surface in the first direction of a bottom layer among the active area layers between the first and second stacked layer structures.

5. The method of claim 4,
wherein a lower surface in the first direction of the second conductive layer is lower than the lower surface in the first direction of the bottom layer between the first and second stacked layer structures.

6. The method of claim 1,
wherein the sacrifice layer is formed in the space between the first and second stacked layer structures.

7. The method of claim 1,
wherein the sacrifice layer is formed to cover the first and second stacked layer structures.

8. The method of claim 7,
wherein the trenches extend along the lines of the line & space pattern in the third direction.

9. The method of claim 1,
wherein the line & space pattern is formed by patterning the first conductive layer and the sacrifice layer using a hard mask layer as a mask, and
the trenches are formed by removing the sacrifice layer and the hard mask layer selectively.

10. The method of claim 1,
wherein the second conductive layer includes at least one of Ni, V, Cr, Mn, Y, Mo, Ru, Rh, Hf, Ta, W, Ir, Co, Ti, Er, Pt, Pd, Zr, Gd, Dy, Ho and Er.

11. The method of claim 1,
wherein the second conductive layer includes at least one of TaN, TiN, TaC, Si-compound and Ge-compound.

12. The method of claim 1,
wherein the second conductive layer is filled in the trenches.

13. The method of claim 1,
wherein the space between the first and second stacked layer structures is not filled with the second conductive layer, and comprises a part of insulator or cavity.

14. The method of claim 1,
wherein the gate insulating layer structure includes a stacked layer structure disposed in order of an insulating layer, a storage layer and an insulating layer from the active area layers.

* * * * *